(12) United States Patent
Wu et al.

(10) Patent No.: US 11,527,679 B2
(45) Date of Patent: Dec. 13, 2022

(54) SEMICONDUCTOR LIGHT EMITTING CHIP AND ITS MANUFACTURING METHOD

(71) Applicant: XIAMEN CHANGELIGHT CO., LTD., Fujian (CN)

(72) Inventors: Xingen Wu, Xiamen (CN); Yingce Liu, Xiamen (CN); Junxian Li, Xiamen (CN); Zhendong Wei, Xiamen (CN)

(73) Assignee: Xiamen Changelight Co., Ltd., Fujian (CN)

( * ) Notice: Subject to any disclaimer, the term of this patent is extended or adjusted under 35 U.S.C. 154(b) by 51 days.

(21) Appl. No.: 16/626,516

(22) PCT Filed: Jul. 30, 2019

(86) PCT No.: PCT/CN2019/098369
§ 371 (c)(1),
(2) Date: Apr. 1, 2020

(87) PCT Pub. No.: WO2020/024935
PCT Pub. Date: Feb. 6, 2020

(65) Prior Publication Data
US 2021/0336089 A1    Oct. 28, 2021

(30) Foreign Application Priority Data
Aug. 3, 2018 (CN) .......................... 201810874009.3

(51) Int. Cl.
*H01L 33/40* (2010.01)
*H01L 33/00* (2010.01)
(Continued)

(52) U.S. Cl.
CPC ........ *H01L 33/405* (2013.01); *H01L 33/0075* (2013.01); *H01L 33/32* (2013.01);
(Continued)

(58) Field of Classification Search
CPC ... H01L 33/405; H01L 33/0075; H01L 33/32; H01L 33/38; H01L 33/44;
(Continued)

(56) References Cited

U.S. PATENT DOCUMENTS

2007/0023777 A1* 2/2007 Sonobe .................... H01L 33/40
257/103
2010/0078656 A1* 4/2010 Seo .......................... H01L 33/60
257/E33.056
(Continued)

*Primary Examiner* — Su C Kim
(74) *Attorney, Agent, or Firm* — Arch & Lake LLP

(57) ABSTRACT

A semiconductor light emitting chip includes a substrate and an N-type semiconductor layer sequentially developed from the substrate, an active region, a P-type semiconductor layer, a reflective layer, at least two insulating layers, an anti-diffusion layer and an electrode set. One of the insulating layers is extended to surround the inner peripheral portion of the reflective layer, and another the insulating layer is extended to surround the outer peripheral portion of the reflective layer, such that the insulating layer isolates the anti-diffusion layer from the P-type semiconductor layer. The electrode set includes an N-type electrode and a P-type electrode, wherein the N-type electrode is electrically connected to the N-type semiconductor layer, and the P-type electrode is electrically connected to the P-type semiconductor layer.

33 Claims, 11 Drawing Sheets

(51) Int. Cl.
  *H01L 33/32* (2010.01)
  *H01L 33/38* (2010.01)
  *H01L 33/44* (2010.01)

(52) U.S. Cl.
  CPC .............. *H01L 33/38* (2013.01); *H01L 33/44* (2013.01); *H01L 2933/0016* (2013.01); *H01L 2933/0025* (2013.01)

(58) Field of Classification Search
  CPC ..... H01L 2933/0016; H01L 2933/0025; H01L 33/382; H01L 33/387; H01L 33/10; H01L 33/36
  See application file for complete search history.

(56) References Cited

U.S. PATENT DOCUMENTS

2012/0273823 A1* 11/2012 Yoneda .................. H01L 24/06
  438/46
2012/0299038 A1* 11/2012 Hwang .................. H01L 33/32
  257/98
2018/0145224 A1* 5/2018 Kim .................... H01L 33/0075

* cited by examiner

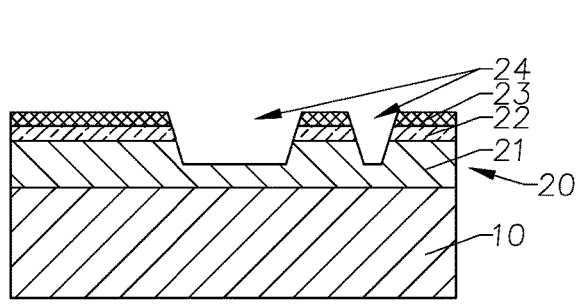
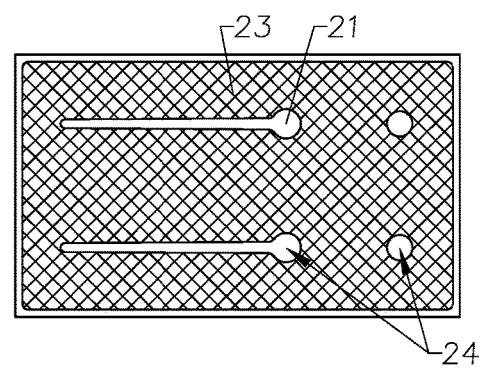
FIG. 1A                     FIG. 1B
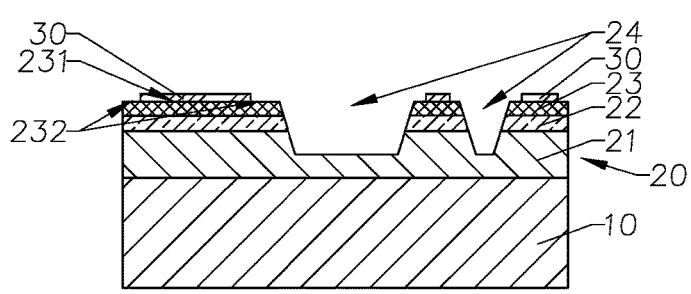
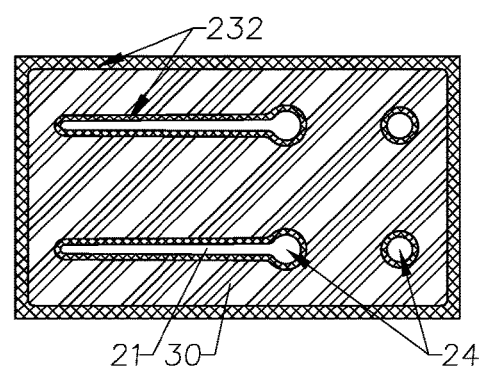
FIG. 2A                     FIG. 2B
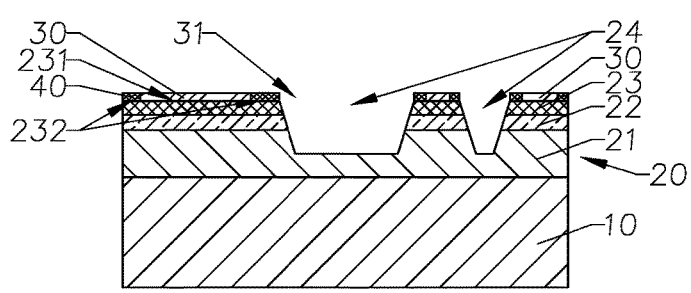
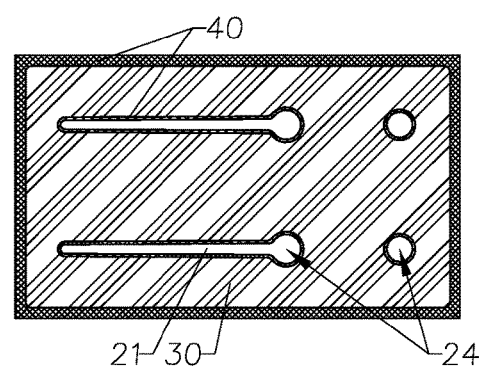
FIG. 3A                     FIG. 3B

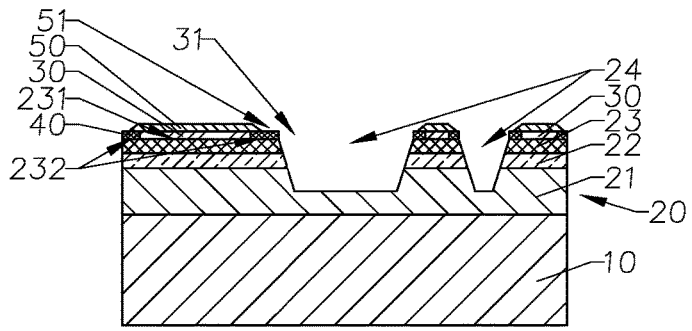
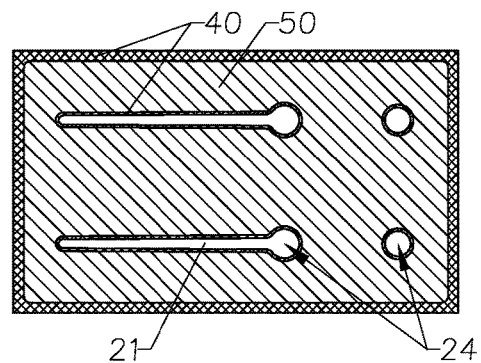
FIG. 4A  FIG. 4B
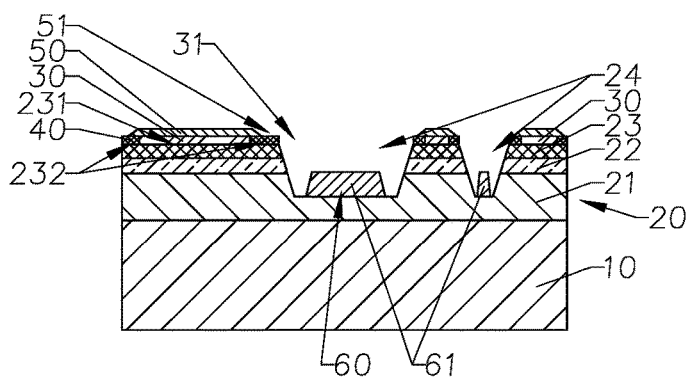
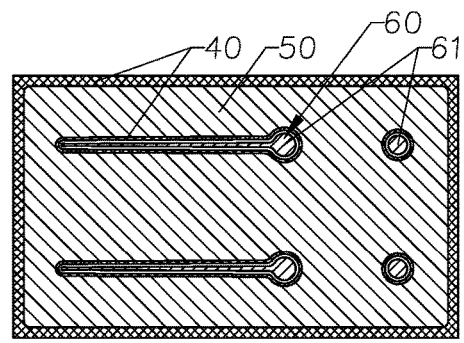
FIG. 5A  FIG. 5B
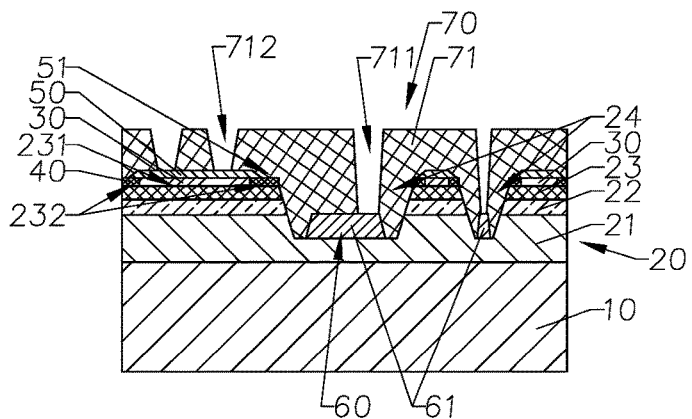
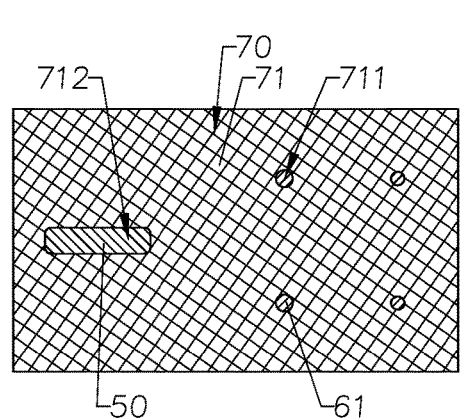
FIG. 6A  FIG. 6B

SEMICONDUCTOR LIGHT EMITTING CHIP AND ITS MANUFACTURING METHOD

CROSS REFERENCE OF RELATED APPLICATION

This is a U.S. National state non-provisional application under 35U.S.C. § 371 of the international application PCT/CN2019/098369, international filing date Jul. 30, 2019, the entire content of which is expressly incorporated herein by reference.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a semiconductor light emitting diode, and more particularly to a semiconductor light emitting chip and its manufacturing method.

Description of Related Arts

Generally speaking, a light reflector, which made of light reflecting material such as silver, is commonly used in a high light intensity flip chip to form a sliver mirror laminated on a P-type gallium nitride layer. However, the energy of the P-type gallium nitride layer is 7.5 eV, and the energy of the silver mirror is 4.26 eV. Theoretically, only when the energy of the silver mirror is greater than the energy of the P-type gallium nitride layer, a low resistance ohmic contact can be formed between the silver mirror and the P-type gallium nitride layer. Practically, since the energy of the silver mirror is smaller than the energy of the P-type gallium nitride layer, low resistance ohmic contact cannot be formed between the silver mirror and the P-type gallium nitride layer. Since the material of the silver mirror is metallic silver which is an active metal, the silver mirror may have phenomenon of metal migration under the conditions of potential difference, high humidity, high temperature, so as to cause the malfunction, such as electrical leakage or operational failure. Therefore, the high light intensity flip chip further comprises an anti-diffusion layer covering on the silver mirror. In other words, the anti-diffusion layer needs to be in direct contact with the P-type gallium nitride layer (the anti-diffusion layer is laminated on the P-type gallium nitride layer) to completely cover the silver mirror. In other words, the dimension, i.e. the length and width, of the anti-diffusion layer must be larger than the dimension of the silver mirror, such that the anti-diffusion layer can be directly laminated on the P-type gallium nitride in order to contact with the P-type gallium nitride layer. Accordingly, the anti-diffusion layer is usually made of a metal material such as titanium (Ti), titanium tungsten (TiW), or nickel (Ni). In actual use, since the contact resistance between the anti-diffusion layer and the P-type gallium nitride layer is lower than the contact resistance between the silver mirror and the P-type gallium nitride layer, the current injected from the P-type electrode will be concentrated at one region (the region where the anti-diffusion layer is in contact with the P-type gallium nitride layer). As a result, the current density in such region will be too high, to cause an abnormal electrostatic punctuation.

SUMMARY OF THE PRESENT INVENTION

The invention is advantageous in that it provides a semiconductor light emitting chip and its manufacturing method thereof, wherein the semiconductor light emitting chip can avoid an abnormal electrostatic punctuation to ensure reliability of the semiconductor light-emitting chip during the operation.

Another advantage of the invention is to provide a semiconductor light emitting chip and its manufacturing method thereof, wherein the semiconductor light emitting chip can avoid an abnormal electrostatic punctuation caused by current accumulation of the semiconductor light emitting chip by preventing an anti-diffusion layer from directly contacting with a P-type semiconductor layer, so as to ensure reliability of the semiconductor light-emitting chip during the operation.

Another advantage of the invention is to provide a semiconductor light emitting chip and its manufacturing method thereof, which comprises an insulating layer to isolate the anti-diffusion layer from the P-type semiconductor layer via the insulating layer so as to prevent the anti-diffusion layer from directly contacting with a P-type semiconductor layer.

Another advantage of the invention is to provide a semiconductor light emitting chip and its manufacturing method thereof, wherein the reflective layer is surrounded by the insulating layer, to prevent the metal migration on the surface of the reflective layer by the anti-diffusion layer by laminating the anti-diffusion layer on the surface of the reflective layer so as to ensure reliability of the semiconductor light-emitting chip.

Another advantage of the invention is to provide a semiconductor light emitting chip and its manufacturing method thereof, wherein after the insulating layer is laminated on the P-type semiconductor layer, the anti-diffusion layer is laminated on the insulating layer and the reflective layer. Through this configuration, the insulating layer not only prevents the anti-diffusion layer from contacting with the P-type semiconductor layer but also enables the insulating layer mutually incorporating with the anti-diffusion layer to enclose the reflective layer, so as to prevent the metal migration on the surface of the reflective layer.

According to the present invention, the foregoing and other objects and advantages are attained by a semiconductor light emitting chip, comprising:

a substrate;

an epitaxial laminating layer which comprises an N-type gallium nitride layer, an active region, and a P-type gallium nitride layer, wherein the substrate, the N-type gallium nitride layer, the active region, and the P-type gallium nitride layer are sequentially overlapped with each other;

at least a reflective layer laminated on a portion of a surface of the P-type gallium nitride layer;

at least two insulating layers, one of the insulating layers laminated on the P-type gallium nitride layer to surround at an inner peripheral portion of the reflective layer while another insulating layer laminated on the P-type gallium nitride layer to surround at an outer peripheral portion of the reflective layer;

at least an anti-diffusion layer laminated on the reflective layer and the insulating layer; and an electrode set which comprises an N-type electrode and a P-type electrode, wherein the N-type electrode is electrically connected to the N-type gallium nitride layer of the epitaxial laminating layer while the P-type electrode is electrically connected to the anti-diffusion layer.

According to one embodiment, the epitaxial laminating layer has at least a semiconductor exposing portion, wherein the semiconductor exposing portion is extended from the P-type gallium nitride layer to the N-type gallium nitride layer through the active region, wherein the anti-diffusion layer has at least an anti-diffusion layer perforation, wherein the semiconductor exposing portion of the epitaxial laminating layer is aligned correspondingly to the anti-diffusion layer perforation of the anti-diffusion layer, wherein the N-type electrode is sequentially extended through the anti-diffusion layer perforation of the anti-diffusion layer and the semiconductor exposing portion of the epitaxial overlapping in order to electrically connect to the N-type gallium nitride layer.

According to one embodiment, the semiconductor light emitting chip further has at least one N-type extension electrode portion laminated on the N-type gallium nitride layer to be retained at the semiconductor exposing portion of the epitaxial exposing layer. The N-type electrode is electrically connected to the N extension electrode portion.

According to one embodiment, the semiconductor light emitting chip further has a first isolation portion, wherein the first isolation portion is extended through a channel of the anti-diffusion layer channel and the semiconductor exposing portion of the epitaxial laminating layer to the N-type gallium nitride layer in order to laminate on the anti-diffusion layer, wherein the first isolation portion has at least one first channel and at least one second channel, wherein the first channel is extended to the N-type extended electrode portion, wherein the N-type electrode is electrically connected to the N-type extension electrode portion through the first channel, wherein the second channel is extended to the anti-diffusion layer, wherein the P-type electrode is electrically connected to the anti-diffusion layer through the second channel.

According to one embodiment, the first isolation portion is further laminated on the insulating layer.

According to one embodiment, the first isolation portion is further laminated on the N-type extension electrode portion.

According to one embodiment, the N-type electrode has at least one N-type electrode connection terminal, wherein when the N-type electrode is laminated on the first isolation portion, the N-type electrode connecting terminal is formed on and retained at the first channel of the first isolation portion, such that the N-type electrode connection terminal is extended to and electrically connected to the N-type extension electrode portion. Correspondingly, the P-type electrode further has at least one P-type electrode connection terminal, wherein when the P-type electrode is laminated on the first isolation portion, the P-type electrode connection terminal is formed and retained at the second channel of the first isolation portion, such that the P-type electrode connection terminal is extended to and electrically connected to the anti-diffusion layer.

According to one embodiment, the semiconductor light emitting chip further has a first isolation portion, wherein the first isolation portion is extended through the anti-diffusion layer perforation of the anti-diffusion layer and the semiconductor exposing portion of the epitaxial laminating layer to the N-type gallium nitride layer in order to laminate on the anti-diffusion layer, wherein the first isolation portion has at least one first channel and at least one second channel, wherein the first channel is extended to the N-type gallium nitride layer, wherein the N-type electrode is electrically connected to the N-type gallium nitride layer through the first channel, wherein the second channel is extended to the P-type gallium nitride layer, wherein the P-type electrode is electrically connected to the anti-diffusion layer through the second channel.

According to one embodiment, the first isolation portion is further laminated the insulating layer.

According to one embodiment, the semiconductor light emitting chip further comprises an extension electrode layer, wherein the extension electrode layer has at least one N-type extended electrode portion and at least one P-type extended electrode portion, wherein the N-type extension electrode portion and the P-type extension electrode portion are respectively stacked on the first isolation portion in an alternating manner, wherein the N-type extended electrode portion has at least one N-type extended electrode terminal extended through the first channel of the first isolation portion to electrical connect to the N-type gallium nitride layer, wherein the P-type extension electrode portion has at least one P-type extension electrode terminal and is extended through the second channel of the first isolation portion to electrically connect to the P-type gallium nitride layer.

According to one embodiment, the semiconductor light emitting chip further includes a second isolation portion, wherein the second isolation portion is laminated on the N-type extension electrode portion, the first isolation portion, and the P-type extension electrode portion, wherein the second isolation portion has at least one third channel and at least one fourth channel, wherein the third channel is extended to the N-type extension electrode portion, wherein the N-type electrode is electrically connected to the N-type extension electrode portion through the third channel, wherein the fourth channel is extended to the P-type extension electrode portion, wherein the P-type electrode is electrically connected to the P-type extension electrode portion through the fourth channel.

According to one embodiment, the N-type electrode has at least one N-type extension connection terminal, wherein when the N-type electrode is stacked on the second isolation portion, the N-type electrode connection terminal is formed at and retained at the third channel of the second isolation portion, wherein the N-type electrode connection pin is extended to and is electrically connected to the N-type electrode connection portion, correspondingly, the P-type electrode has at least one P-type electrode connection terminal, wherein when the P-type electrode is stacked on the second isolation portion, the P-type electrode connection terminal is formed at and retained at the fourth channel of the second isolation portion, wherein the P-type electrode connection terminal is extended to and is electrically connected to the P-type extension electrode portion.

According to one embodiment, the thickness of the reflective layer is the same as the thickness of the insulating layer.

According to one embodiment, the insulating layer is made of silicon dioxide.

According to one embodiment, the thickness of the insulating layer has a range from 100 angstroms to 5,000 angstroms.

In accordance with another aspect of the invention, the present invention comprises a method of manufacturing the semiconductor light emitting chip, which comprises the following steps.

(a) Sequentially develop and form a N-type gallium nitride layer, the active region, and a P-type gallium nitride layer on a substrate.

(b) Laminate a reflective layer on a portion of the surface of the P-type gallium nitride layer.

(c) Extend an insulating layer to surround the inner peripheral portion and the outer peripheral portion of the reflective layer respectively.

(d) Develop an anti-diffusion layer from the reflective layer and the insulating layer.

(e) Electrically connect a N-type electrode to the N-type gallium nitride layer and electrically connect a P-type electrode to an anti-diffusion layer to form the semiconductor light emitting chip.

According to one embodiment, in the step (c), the insulating layer is developed from the P-type gallium nitride layer to surround the reflective layer.

According to one embodiment, in the step (c), the insulating layer is developed from the active region to surround the reflective layer.

According to one embodiment, in the step (c), the insulating layer is developed from the N-type gallium nitride layer to surround the reflective layer.

According to one embodiment, in the step (c), the insulating layer is developed from the substrate to surround the reflective layer.

According to one embodiment, before the step (c), the manufacturing method further comprises a step of: etching the P-type gallium nitride layer and the active region in sequence to form at least one semiconductor exposing portion extended from the P-type gallium nitride layer through the active region to the N-type gallium nitride layer, wherein in the step (d), at least one anti-diffusion layer perforation is formed when the anti-diffusion layer is developed on the reflective layer and the insulating layer, wherein the semiconductor exposing portion is aligned correspondingly to the anti-diffusion layer perforation, wherein in the step (e), the N-type electrode is allowed to be sequentially extended through the anti-diffusion layer and the semiconductor exposing portion in order to electrically connect to the N-type gallium nitride layer.

According to one embodiment, before the step (c), the manufacturing method further comprises a step of: etching the P-type gallium nitride layer, the active region, and the N-type gallium nitride layer in sequence to form at least one semiconductor exposing portion extended from P-type gallium nitride layer through the active region to the N-type gallium nitride layer, wherein in the step (d), at least one anti-diffusion layer perforation is formed when the anti-diffusion layer is developed on the reflective layer and the insulating layer, wherein the semiconductor exposing portion is aligned correspondingly to the anti-diffusion layer perforation, wherein in the step (e), the N-type electrode is allowed to be sequentially extended through the anti-diffusion layer and the semiconductor exposing portion in order to electrically connect to the N-type gallium nitride layer.

According to one embodiment, before the step (e), the manufacturing method further comprises a step of: developing at least one N-type extension electrode portion on the N-type gallium nitride layer, wherein in the step (e), the N-type electrode is electrically connected to the N-type gallium nitride layer so as to electrically connect to the N-type extension electrode portion.

According to one embodiment, before the step (e), the manufacturing method further comprises a step of: developing a first isolation portion to the anti-diffusion layer, wherein the first isolation portion is extended through the anti-diffusion layer and the semiconductor exposing portion to the N-type gallium nitride layer, wherein the first isolation portion has at least one first channel and at least one second channel, wherein the first channel is extended to the N-type extended electrode portion, wherein the N-type electrode is electrically connected to the N-type extension electrode portion through the first channel, wherein the second channel is extended to the anti-diffusion layer, wherein the P-type electrode is electrically connected to the anti-diffusion layer through the second channel.

According to one embodiment, in the step of developing the first isolation portion in the anti-diffusion layer, the method further comprises the steps of:

developing a first isolation base layer to the anti-diffusion layer; and etching the first isolation base layer to form a first channel extended to the N-type extension electrode portion and a second channel extended to the anti-diffusion layer, wherein the first isolation base layer is formed as the first isolation portion.

According to one embodiment, in the above method, the first isolation portion is laminated on the insulating layer.

According to one embodiment, in the above method, the first isolation portion is laminated on the N-type extension electrode portion.

According to one embodiment, in the step (e), the method further comprises the steps of:

(e.1) developing the N-type electrode from the first isolation portion, wherein in a developing process of the N-type electrode, an N-type electrode connection terminal of the N-type electrode is formed at the first channel of the first isolation portion and is electrically connected to the N-type extension electrode portion through the first channel; and (e.2) developing the P-type electrode from the first isolation portion, wherein in a developing process of the P-type electrode, a P-type electrode connection terminal of the P-type electrode is formed at the second channel of the first isolation portion and is electrically connected to the anti-diffusion layer through the second channel.

According to one embodiment, before the step (e), the method further comprises a step of: developing a first isolation portion to the anti-diffusion layer, wherein the first isolation portion is extended through the anti-diffusion layer and the semiconductor exposed portion to the N-type gallium nitride layer, wherein the first isolation portion has at least one first channel and at least one second channel, wherein the first channel is extended to the N-type gallium nitride layer, wherein the N-type electrode is electrically connected to the N-type gallium nitride layer through the first channel, wherein the second channel is extended to the anti-diffusion layer, wherein the P-type electrode is electrically connected to the anti-diffusion layer through the second channel.

According to one embodiment, in the developing step of the first isolation portion in the anti-diffusion layer, the method further comprises the steps of:

developing a first isolation base layer to the anti-diffusion layer; and etching the first isolation base layer to form a first channel extended to the N-type extension electrode portion and a second extended to the anti-diffusion layer, wherein the first isolation base layer is formed as the first isolation portion.

According to one embodiment, in the above method, the first isolation portion is laminated at the insulating layer.

According to one embodiment, after the first isolation portion is developed on the anti-diffusion layer, the manufacturing method further comprises the steps of:

developing an N-type extended electrode portion from the first isolation portion, wherein in the developing process of the N-type extension electrode portion, a N-type extension electrode terminal of the N-type extension electrode portion is formed at the first channel of the first isolation portion and is extended to the N-type gallium nitride layer through the first channel; and developing a P-type extended electrode portion from the first isolation portion, wherein in the developing process of the P-type extension electrode portion, a P-type extension electrode terminal of the P-type extension electrode portion is formed at the second channel of the first isolation portion and is extended to the anti-diffusion layer through the second channel.

According to one embodiment, after the N-type extension electrode portion and the P-type extension electrode portion are developed to the first isolation portion, the manufacturing method further comprises a step of: forming a second isolation portion on the N-type extension electrode portion, the first isolation portion, and the P-type extension electrode portion, wherein the second isolation portion has at least one third channel and at least one fourth channel, wherein the third channel is extended to the N-type extension electrode portion, wherein the N-type electrode is electrically connected to the N-type extension electrode portion through the third channel, wherein the fourth channel is extended to the P-type extension electrode portion, wherein the P-type electrode is electrically connected to the P-type extension electrode portion through the fourth channel.

According to one embodiment, in the developing process of the second isolation portion at the N-type extension electrode portion, the first isolation portion, and the P-type extension electrode portion, the method further comprises the steps of:

developing a second isolation base layer on the N-type extension electrode portion, the first isolation portion, and the P-type extension electrode portion; and etching the second isolation base layer to form a third channel extended to the N-type extension electrode portion and a fourth channel extended to the P-type extension electrode portion, wherein the second isolation base layer is formed as the second isolation portion.

According to one embodiment, in the step (e), the method further comprises the steps of:

(e.1) developing the N-type electrode from the second isolation portion, wherein in a developing process of the N-type electrode, an N-type electrode connection terminal of the N-type electrode is formed at the third channel of the second isolation portion and is electrically connected to the N-type extension electrode portion through the third channel; and (e.2) developing the P-type electrode from the first isolation portion, wherein in a developing process of the P-type electrode, a P-type electrode connection terminal of the P-type electrode is formed at the fourth channel of the second isolation portion and is electrically connected to the anti-diffusion layer through the fourth channel.

BRIEF DESCRIPTION OF THE DRAWINGS

FIG. 1A is a sectional view of a semiconductor light emitting chip according to a preferred embodiment of the present invention, illustrating a first step of the manufacturing method.

FIG. 1B is a top view of the semiconductor light emitting chip according to the above preferred embodiment of the present invention, illustrating the first step of the manufacturing method.

FIG. 2A is a sectional view of the semiconductor light emitting chip according to the above preferred embodiment of the present invention, illustrating a second step of the manufacturing method.

FIG. 2B is a top view of the semiconductor light emitting chip according to the above preferred embodiment of the present invention, illustrating the second step of the manufacturing method.

FIG. 3A is a sectional view of the semiconductor light emitting chip according to the above preferred embodiment of the present invention, illustrating a third step of the manufacturing method.

FIG. 3B is a top view of the semiconductor light emitting chip according to the above preferred embodiment of the present invention, illustrating the third step of the manufacturing method.

FIG. 4A is a sectional view of the semiconductor light emitting chip according to the above preferred embodiment of the present invention, illustrating a fourth step of the manufacturing method.

FIG. 4B is a top view of the semiconductor light emitting chip according to the above preferred embodiment of the present invention, illustrating the fourth step of the manufacturing method.

FIG. 5A is a sectional view of the semiconductor light emitting chip according to the above preferred embodiment of the present invention, illustrating a fifth step of the manufacturing method.

FIG. 5B is a top view of the semiconductor light emitting chip according to the above preferred embodiment of the present invention, illustrating the fifth step of the manufacturing method.

FIG. 6A is a sectional view of the semiconductor light emitting chip according to the above preferred embodiment of the present invention, illustrating a sixth step of the manufacturing method.

FIG. 6B is a top view of the semiconductor light emitting chip according to the above preferred embodiment of the present invention, illustrating the sixth step of the manufacturing method.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

It is appreciated that the terms "longitudinal", "transverse", "upper", "lower", "front", "rear", "left", "right", "vertical", "horizontal", "top", "bottom", "exterior", and "interior" in the following description refer to the orientation or positioning relationship in the accompanying drawings for easy understanding of the present invention without limiting the actual location or orientation of the present invention. Therefore, the above terms should not be an actual location limitation of the elements of the present invention.

It is appreciated that the terms "one", "a", and "an" in the following description refer to "at least one" or "one or more" in the embodiment. In particular, the term "a" in one embodiment may refer to "one" while in another embodiment may refer to "more than one". Therefore, the above terms should not be an actual numerical limitation of the elements of the present invention.

Figure 7A:
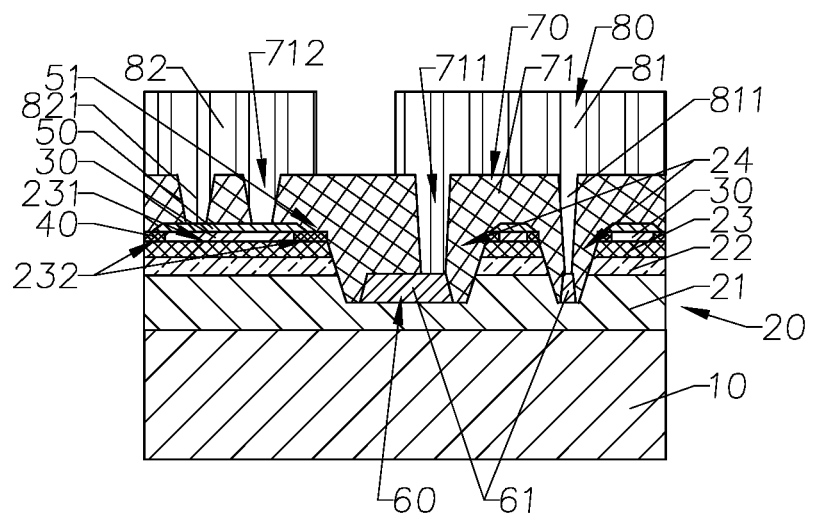
FIG. 7A is a sectional view of the semiconductor light emitting chip according to the above preferred embodiment of the present invention, illustrating a seventh step of the manufacturing method and the sectional state of the semiconductor light emitting chip.
Figure 7B:
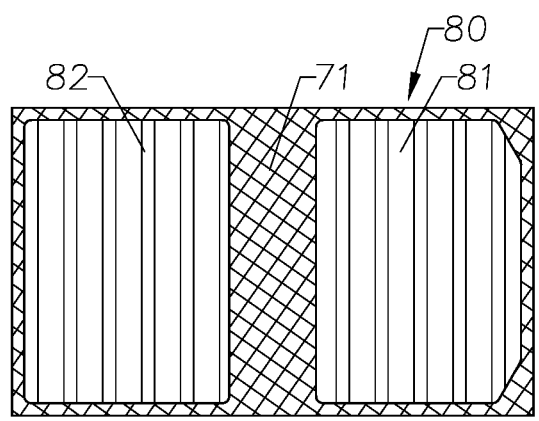
FIG. 7B is a top view of the semiconductor light emitting chip according to the above preferred embodiment of the present invention, illustrating the seventh step of the manufacturing method and the top state of the semiconductor light emitting chip.

Referring to FIGS. 7A and 7B of the drawings, a semiconductor light emitting chip according to a preferred embodiment of the present invention is illustrated, wherein the semiconductor light emitting chip comprises a substrate 10, an epitaxial laminating layer 20, a reflective layer 30, at least one insulating layer 40, an anti-diffusion layer 50, an extension electrode layer 60, a galvanic isolation layer 70, and an electrode set 80.

FIGS. 1A to 7B illustrate the manufacturing method of the semiconductor light emitting chip to explain the relationships among the substrate 10, the epitaxial laminating layer 20, the reflective layer 30, the insulating layer 40, the anti-diffusion layer 50, the extension electrode layer 60, the galvanic isolation layer 70, and the electrode set 80.

As shown in FIGS. 1A and 1B, the epitaxial laminating layer 20 comprises an N-type semiconductor layer 21, an active region 22, and a P-type semiconductor layer 23. The N-type semiconductor layer 21 is developed and formed on the substrate 10, wherein the N-type semiconductor layer 21 is stacked, preferably laminated, on the substrate 10. The active region 22 is developed and formed on the N-type semiconductor layer 21, wherein the active region 22 is stacked, preferably laminated, on the N-type semiconductor layer 21. The P-type semiconductor layer 23 is developed and formed on the active region 22, wherein the P-type semiconductor layer 23 is stacked, preferably laminated, on the active region 22.

Preferably, according to the preferred embodiment as an example of the semiconductor light emitting chip of the present invention, each of the N-type semiconductor layer 21 and the P-type semiconductor layer 23 can be implemented as a gallium nitride layer. In other words, the epitaxial laminating layer 20 comprises an N-type gallium nitride layer overlapped, preferably laminated, on the substrate 10, and a P-type gallium nitride layer overlapped, preferably laminated, on the active region 22.

It is worth mentioning that, according to the semiconductor light emitting chip of the present invention, the stacking configuration between the epitaxial laminating layer 20 and the substrate 10 should not be limited. For example, as shown in FIGS. 1A to 7B, the semiconductor light emitting chip can be implemented by Metal-organic Chemical Vapor Deposition (MOCVD) to deposit the N-type semiconductor layer 21 on the substrate 10, to deposit the active region 22 on the N-type semiconductor layer 21, and to deposit the P-type semiconductor layer 23 on the active region 22.

It is worth mentioning that the type of the substrate 10 should not be limited in the semiconductor light emitting chip of the present invention. For example, the substrate 10 may be, but not limited to, an aluminum oxide ($Al_2O_3$)

substrate, a silicon carbide (SiC) substrate, a silicon (Si) substrate, a gallium nitride (GaN) substrate, a gallium arsenide (GaAs) substrate, and gallium phosphide (GaP) substrate.

As shown in FIGS. 1A and 1B, the epitaxial laminating layer 20 further has at least a semiconductor exposing portion 24, wherein the semiconductor exposing portion 24 is extended from the P-type semiconductor layer 23 to the N-type semiconductor layer 21 through the active region 22, such that at least a surface portion of the N-type semiconductor layer 21 is exposed at the semiconductor exposing portion 24.

Preferably, after the epitaxial laminating layer 20 is formed on the substrate 10, the semiconductor exposing portion 24 can be formed by etching the epitaxial laminating layer 20. Specifically, a positive photoresist can be firstly used for forming epitaxial laminating layer 20 on the substrate 10 through photolithography in order to expose an area of the epitaxial laminating layer 20 where it is needed to be etched. The thickness of the photoresist is set to be 3 μm to 5 μm (including 3 μm and 5 μm). Then, after heating up the photoresist, the epitaxial laminating layer 20 is dry-etched by using Inductively Coupled Plasma (ICP). The semiconductor exposing portion 24 of the epitaxial laminating layer 20 is formed and extended from the P-type semiconductor layer 23 to the N-type semiconductor layer 21 through the active region 22. Finally, the photoresist on the surface of the P-type semiconductor layer 23 is removed. The gas being used in the dry-etching of the epitaxial laminating layer 20 via the Inductively Coupled Plasma machine can be chlorine (Cl2), boron trichloride (BCl3), and argon (Ar). In addition, an etch depth of the epitaxial laminating layer 20 is set between 0.9 μm and 2 μm (including 0.9 μm and 2 μm) when using the Inductively Coupled Plasma machine. In other words, the depth of semiconductor exposing portion 24 of the epitaxial laminating layer 20 is set between 0.9 μm and 2 μm (including 0.9 μm and 2 μm).

According to the preferred embodiment as shown in FIGS. 1A to 7B, a portion of the thickness of the N-type semiconductor layer 21 is also etched with a reduced thickness thereof, such that the semiconductor exposing portion 24 is extended from the P-type semiconductor layer 23 through the active region 22 to a middle portion of the N-type semiconductor layer 21. Therefore, the thickness of the N-type semiconductor layer 21 corresponding to the semiconductor exposing portion 24 is smaller than the thickness of other portions of the N-type semiconductor layer 21.

It is worth mentioning that the number and type of the semiconductor exposing portions 24 of the epitaxial laminating layer 20 should not be limited in the semiconductor light emitting chip of the present invention. For example, in one example as shown in FIG. 1B, there are four semiconductor exposing portions 24. Two of the semiconductor exposing portions 24 are formed in circular shape and are located at one end of the semiconductor light emitting chip. For the other two semiconductor exposing portions 24, each of the semiconductor exposing portions 24 has a soldering pad exposing portion at the middle of the semiconductor exposing chip and an elongated extending exposing portion extended from the soldering pad exposing portion toward the semiconductor light emitting chip. Of course, a person who skilled in the art will appreciate that the type of semiconductor exposing portion 24 in FIG. 1B is merely an example and should not be limiting the content and scope of the semiconductor light emitting chip of the present invention.

As shown in FIGS. 2A and 2B, the reflective layer 30 is formed on, preferably deposited on, the P-type semiconductor layer 23 of the epitaxial laminating layer 20, such that the reflective layer 30 is arranged to overlap on a part of the surface of the semiconductor layer 23 of the epitaxial laminating layer 20.

Particularly, a negative photoresist is applied on the surface of the P-type semiconductor layer 23 of the epitaxial laminating layer 20 to etch a desired pattern thereon via photolithography. Then, the reflective layer 30 is deposited on the pattern by vapor deposition or sputter coating. Finally, the negative photoresist is removed. Preferably, the reflective layer 30 is configured with a laminated structure. For example, the reflective layer 30 can be configured with the laminated structure of combination of silver (Ag) and titanium tungsten (TiW). The thickness of the silver layer has a range from 1000 angstroms to 3,000 angstroms (including 1000 angstroms and 3,000 angstroms), and the thickness of the titanium tungsten layer has a range from 200 angstroms to 2,000 angstroms (including 200 angstroms and 2000 angstroms). Preferably, since the reflective layer 30 is deposited on a portion of the surface of the P-type semiconductor layer 23 by vapor deposition or sputtering, it is necessary to use a blue film glass to remove excess metal layer before removing the negative photoresist.

The reflective layer 30 has at least one reflective layer perforation 31, wherein the semiconductor exposing portion 24 of the epitaxial laminating layer 20 is aligned correspondingly with the reflective layer perforation 31 of the reflective layer 30, such that the semiconductor exposing portion 24 of the epitaxial laminating layer 20 and the reflective layer perforation 31 of the reflective layer 30 are communicated with each other. Preferably, the shape of the reflective layer perforation 31 of the reflective layer 30 matches with the shape of the semiconductor exposing portion 24 of the epitaxial laminating layer 20. The size of the reflective layer perforation 31 of the reflective layer 30 is larger than the size of the semiconductor exposing portion 24 of the epitaxial laminating layer 20. In this manner, after the reflective layer 30 is laminated on the P-type semiconductor layer 23 of the epitaxial laminating layer 20, a portion of the surface of the P-type semiconductor layer 23 is exposed through the reflective layer perforation 31 of the reflective layer 30. In addition, the dimension, i.e. the length and width, of the reflective layer 30 is smaller than the dimension of the P-type semiconductor layer 23 of the epitaxial laminating layer 20. Therefore, after the reflective layer 30 is laminated on the P-type semiconductor layer 23 of the epitaxial laminating layer 20, the peripheral surface of the epitaxial laminating layer 20 is exposed as it is not covered by the reflective layer 30.

In other words, the surface of the P-type semiconductor layer 23 of the epitaxial laminating layer 20 has at least a first region 231 and at least two second regions 232, wherein the two second regions 232 are respectively defined as an outer side and an inner side of any one of the first regions 231. For example, in one example as shown in FIG. 1B, the surface of the P-type semiconductor layer 23 of the epitaxial laminating layer 20 has one first region 231 and two second regions 232. One of the second regions 232 is configured to surround the semiconductor exposing portion 24 to form at a middle of the P-type semiconductor layer 23. Another one of the second regions 232 is formed at a peripheral surface of the P-type semiconductor layer 23. The first region 231 is formed before the two second regions 232. The reflective layer 30 is extended from the first region 231 of the P-type semiconductor layer 23 in order to overlap on the P-type semiconductor layer 23. In other words, one of the second regions 232 of the P-type semiconductor layer 23 is a region of the P-type semiconductor layer 23 being exposed to the reflective layer perforation 31 of the reflective layer 30. The other second region 232 of the P-type semiconductor layer 23 is a peripheral surface of the P-type semiconductor layer 23 being uncovered by the reflective layer 30.

As shown in FIGS. 3A and 3B, the insulating layer 40 is extended from at least a portion of the surface of the second region 232 of the P-type semiconductor layer 23 of the epitaxial laminating layer 20, such that the insulating layer 40 is configured to surround the outer peripheral portion and an inner peripheral portion of the reflective layer 30. The insulating layer 40 is able to prevent the reflective layer 30 from exhibiting metal migration at the outer peripheral portion and an inner peripheral portion thereof by surrounding the outer peripheral portion and an inner peripheral portion of the reflective layer 30 with the insulating layer 40, so as to ensure the stability of the reflective layer 30 to further enhance stability of the semiconductor light emitting chip.

Particularly, after the reflective layer 30 is deposited at the first region 231 of the P-type semiconductor layer 23 of the epitaxial laminating layer 20, the insulating layer 40 is deposited on at least a portion of the surface of the second region 232 of the P-type semiconductor layer 23 by vapor deposition, sputtering, or plasma enhanced chemical Vapor Deposition (PECVD), such that the outer peripheral portion and an inner peripheral portion of the reflective layer 30 are surrounded by the insulating layer 40. Preferably, the insulating layer 40 is laminated on the entire area of the second region 232 of the P-type semiconductor layer 23. It is worth mentioning that the insulating layer 40 can further cover at least a portion of the surface of the reflective layer 30. Preferably, the insulating layer 40 can be fabricated by using, but not limited to, negative adhesive remover or positive gel etching.

Preferably, the material of the insulating layer 40 can be silicon dioxide ($SiO_2$) such that the insulating layer 40 forms a silicon dioxide layer to surround the outer peripheral portion and the inner peripheral portion of the reflective layer 30. Preferably, the thickness of the insulating layer 40 has a range from 100 angstroms to 5,000 angstroms (including 100 angstroms and 5000 angstroms).

It is worth mentioning that, in the example shown in FIGS. 3A and 3B, the thickness of the insulating layer 40 is the same as the thickness of the reflective layer 30. However, it should be understood by those skilled in the art that in other possible examples of the semiconductor light emitting chip of the present invention, the thickness of the insulating layer 40 can be greater than the thickness of the reflective layer 30. Therefore, the insulating layer 40 is elevated above the reflective layer 30. Likewise, the thickness of the insulating layer 40 can be smaller than the thickness of the reflective layer 30, such that the insulating layer 40 is lower than the reflective layer 30.

As shown in FIGS. 4A and 4B, the anti-diffusion layer 50 is deposited on the reflective layer 30 and the insulating layer 40, such that the anti-diffusion layer 50 is laminated on the reflective layer 30 and the insulating layer 40. The anti-diffusion layer 50 can prevent the metal migration on the surface of the reflective layer 30 by laminating the anti-diffusion layer 50 on the surface of the reflective layer 30. It is because the insulating layer 40 is configured to surround the outer peripheral portion and the inner peripheral portion of the reflective layer 30 to prevent the reflective layer 30 from being metal migration to the outer peripheral portion and the inner peripheral portion of the insulating layer 40. Thus, the anti-diffusion layer 50 is laminated on the surface of the reflective layer 30 to prevent the metal migration on the surface of the reflective layer 30 by the anti-diffusion layer 50. Therefore, the reflective layer 30 is coated by the insulating layer 40 and the anti-diffusion layer 50 at the same time to prevent the occurrence of metal migration to ensure the stability of the reflective layer 30, so as to enhance the stability of the semiconductor light emitting chip.

Since the anti-diffusion layer 50 is laminated on the reflective layer 30 and the insulating layer 40, the insulating layer 40 can isolate the anti-diffusion layer 50 and the P-type semiconductor layer 23, such that the insulating layer 40 is configured to prevent the anti-diffusion layer 50 from directly contacting with the P-type semiconductor layer 23. Through this configuration, it can avoid an abnormal electrostatic punctuation caused by current accumulation of the semiconductor light emitting chip after being de-energized so as to ensure reliability of the semiconductor light-emitting chip during the operation.

The anti-diffusion layer 50 has at least one anti-diffusion layer perforation 51, wherein the semiconductor exposing portion 24 of the epitaxial laminating layer 20 is aligned corresponding to the anti-diffusion layer perforation 51 of the anti-diffusion layer 50, such that semiconductor exposing portion 24 of the epitaxial laminating layer 20 and the anti-diffusion layer perforation 51 of the anti-diffusion layer 50 are communicatively connected with each other. Preferably, the shape of the anti-diffusion layer perforation 51 of the anti-diffusion layer 50 is identical to the shape of the semiconductor exposing portion 24 of the epitaxial laminating layer 20.

Preferably, the anti-diffusion layer perforation 51 of the anti-diffusion layer 50 is developed and formed at the same time when the diffusion prevention layer 50 is developed and formed on the reflective layer 30 and the insulating layer 40. Particularly, a negative photoresist is applied on a surface of an outer peripheral portion of the anti-diffusion layer 50 to etch a desired pattern thereon via photolithography. Then, the anti-diffusion layer 50 is deposited on the pattern by vapor deposition or sputter coating, such that the anti-diffusion layer 50 is laminated on the inner peripheral surfaces of the reflective layer 30 and the insulating layer 40. Then, blue film is used to remove excess metal layer before removing the negative photoresist. Finally, the photoresist layer on the surface of the insulating layer 40 is removed to form the anti-diffusion layer perforation 51 of the diffusion prevention layer 50.

Preferably, the anti-diffusion layer 50 is configured to have a laminated structure. For example, the laminated structure of the diffusion prevention layer 50 is a combination of titanium tungsten (TiW) and platinum (Pt).

As shown in FIGS. 5A and 5B, the extension electrode layer 60 has at least one N-type extension electrode portion 61, wherein the N-type extension electrode portion 61 is retained at and extended from the N-type semiconductor layer 21 of the epitaxial laminating layer 20 at the semiconductor exposing portion 24 thereof.

Preferably, the size and shape of the N-type extension electrode portion 61 matches with the size and shape of the semiconductor exposing portion 24 of the epitaxial laminating layer 20. Particularly, when the shape of the semiconductor exposing portion 24 of the epitaxial laminating layer 20 is formed in a circular shape, the N-type extension electrode portion 61 is correspondingly formed in a circular shape. When the semiconductor exposing portion 24 of the epitaxial laminating layer 20 is formed in a keyhole shape with the soldering pad exposing portion and the extending exposing portion, the N-type extended electrode portion 61 is correspondingly formed with a key shape to include a pad and the elongated pad extension. Regarding the size of the N-type extension electrode portion 61 matching with the size of the semiconductor exposing portion 24 of the epitaxial laminating layer 20, it refers to the size of the N-type extension electrode portion 61 is slightly smaller than the size of the semiconductor exposing portion 24 of the epitaxial laminating layer 20 to prevent the N-type extended electrode portion 61 from contacting the active region 22 and the P-type semiconductor layer 23 around the semiconductor exposing portion 24.

The N-type extension electrode portion 61 is laminated on the N-type semiconductor layer 21 by means of negative adhesive removing method. Particularly, a negative photoresist is applied at the semiconductor exposing portion 24 of the epitaxial laminating layer 20 to etch a desired pattern thereon via photolithography in order for depositing and forming the N-type extension electrode portion 61. Then, the N-type extension electrode portion 61 is deposited on the pattern by vapor deposition or sputter coating, such that the N-type extension electrode portion 61 is laminated on and retained at the N-type semiconductor layer 21 at the semiconductor exposing portion 24. Then, blue film is used to remove excess metal layer. Finally, the photoresist layer on the surface of the insulating layer 40 is removed to form the N-type extension electrode portion 61.

Preferably, the N-type extension electrode portion 61 is a reflection-extension electrode portion adapted for reflecting light generated by the active region 22. Preferably, the material of the N-type extension electrode portion 61 is selected from a group consisting of chromium (Cr), aluminum (Al), titanium (Ti), platinum (Pt), and gold (Au). Therefore, the N-type extension electrode portion 61 has a light reflecting function to reflect the light generated by the active region 22.

As shown in FIGS. 6A and 6B, the galvanic isolation layer 70 has a first isolation portion 71. The first isolation portion 71 is formed on the insulating layer 40, the diffusion prevention layer 50, the epitaxial laminating layer 20, and the N-type extension electrode portion 61. In other words, the first isolation portion 71 is sequentially extended through the anti-diffusion layer perforation 51 of the anti-diffusion layer 50 and the semiconductor exposing portion 24 of the epitaxial laminating layer 20 to the N-type semiconductor layer 21. Therefore, the first isolation portion 71 is arranged to isolate the N-type extension electrode portion 61 from the active region 22 and to isolate the N-type extension electrode portion 61 from the P-type semiconductor layer 23. Accordingly, the first isolation portion 71 has at least one first channel 711 and at least one second channel 712, wherein the first channel 711 is extended to the N-type extension electrode portion 61 to expose at least a portion of the N-type extension electrode portion 61 through the first channel 711. The second channel 712 is extended to the anti-diffusion layer 50 to expose at least a portion of the anti-diffusion layer 50 through the second channel 712.

Particularly, a first isolation base layer is initially developed and deposited on the insulating layer 40, the anti-diffusion layer 50, the epitaxial laminating layer 20, and the N-type extension electrode portion 61, wherein the first isolation base layer is sequentially extended through the anti-diffusion layer perforation 51 of the anti-diffusion layer 50 and the semiconductor exposing portion 24 of the epitaxial laminating layer 20 to the N-type semiconductor layer 21. Therefore, the first isolation base layer is formed to isolate the N-type extension electrode portion 61 from the active region 22 and to isolate the N-type extension electrode portion 61 from the P-type semiconductor layer 23. Then, an etching position of the first isolation base layer is determined via photoresist lithography, wherein the first isolation base layer is then etched by using Inductively Coupled Plasma (ICP). Therefore, the first channel 711 is formed and extended to the N-type extension electrode portion 61 while the second channel 712 is formed and extended to the anti-diffusion layer 50. Accordingly, the first isolation substrate layer is arranged to form the first isolation portion 71 once the first channel 711 and the second channel 712 are formed.

Preferably, the first isolation portion 71 is a distributed via Bragg Reflection (DBR), wherein the first isolation portion 71 is made of silicon oxide and titanium oxide in an overlapping structure. Accordingly, the first isolation portion 71 is configured and designed with different reflective layer pairs for different wavelengths. For example, in one example of the semiconductor light emitting chip of the present invention, the reflective layer pairs of the first isolation portion 71 have a logarithm range of 20 to 50 (including 20 pairs and 50 pairs).

As shown in FIGS. 7A and 7B, the electrode set 80 comprises an N-type electrode 81 and a P-type electrode 82, wherein the N-type electrode 81 and the P-type electrode 82 are stacked on the first isolation portion 71 in an alternating manner. Furthermore, the N-type electrode 81 is extended through the first channel 711 of the first isolation portion 71 to the N-type extension electrode portion 61, and the P-type electrode 82 is extended through the second channel 712 of the first isolation portion 71 to the anti-diffusion layer 50.

Particularly, the N-type electrode 81 further has at least one N-type electrode connection terminal 811 having a pin shape, wherein when the N-type electrode 81 is laminated on the first isolation portion 71, the N-type electrode connecting terminal 811 is formed and retained at the first channel 711 of the first isolation portion 71, such that the N-type electrode connection terminal 811 of the N-type electrode 81 is extended to the N-type extension electrode portion 61 through the first channel 711 of the first isolation portion 71. Correspondingly, the P-type electrode 82 further has at least one P-type electrode connection terminal 821 having a pin shape, wherein when the P-type electrode 82 is laminated on the first isolation portion 71, the P-type electrode connection terminal 821 is formed and retained at the second channel 712 of the first isolation portion 71, such that the P-type electrode connection terminal 821 of the P-type electrode 82 is extended to the anti-diffusion layer 50 through the second channel 712 of the first isolation portion 71.

Preferably, the thickness of each of the N-type electrode 81 and the P-type electrode 82 has a range from 1 μm to 5 μm (including 1 μm and 5 μm), wherein the thickness of the N-type electrode 81 refers to the thickness of a main body portion of the N-type electrode 81. In other words, the thickness of the N-type electrode 81 should not be counted by an extension length of the N-type electrode connection terminal 811. Correspondingly, the thickness of the P-type electrode 82 refers to the thickness of a main body portion of the P-type electrode 82. In other words, the thickness of the P-type electrode 82 should not be counted by an extension length of the P-type electrode connection terminal 821.

The N-type electrode 81 and the P-type electrode 82 are laminated on the first isolation portion 71 by means of a negative adhesive removing method. Particularly, a negative photoresist is applied on the first isolation portion 71 to etch a desired pattern thereon via photolithography for forming the N-type electrode 81 and the P-type electrode 82. Then, the N-type electrode 81 and the P-type electrode 82 are deposited on the pattern by vapor deposition or sputtering. Therefore, the N-type electrode connection terminal 811 of the N-type electrode 81 is held at the first channel 711 of the first isolation portion 71 and is extended through the first channel 711 to the N-type extension electrode portion 61. At the same time, the P-type electrode connection terminal 821 of the P-type electrode 82 is held at the second channel 712 of the first isolation portion 71 and is extended through the second channel 712 to the anti-diffusion layer 50. Then, blue film is used to remove excess metal layer before removing the negative photoresist. Finally, the photoresist layer is removed to form the N-type electrode 81 and the P-type electrode 82. Preferably, the N-type electrode 81 and the P-type electrode 82 are reflective electrodes adapted for reflecting light generated by the active region 22. Optionally, the N-type electrode 81 and the P-type electrode 82 is made of material selected from a group consisting of chromium (Cr), aluminum (Al), titanium (Ti), platinum (Pt), and gold (Au). The N-type electrode 81 and the P-type electrode 82 should be made of the material having a function of reflecting light generated by the active region 22.

Accordingly, the present invention further provides a method of manufacturing the semiconductor light emitting chip, which comprises the following steps.

(a) Sequentially develop and form the N-type semiconductor layer 21, the active region 22, and the P-type semiconductor layer 23 on the substrate 10.

(b) Laminate the reflective layer 30 on a portion of the surface of the P-type semiconductor layer 23.

(c) Extend the insulating layer 40 to surround the inner peripheral portion and the outer peripheral portion of the reflective layer 30 respectively.

(d) Develop the anti-diffusion layer 50 from the reflective layer 30 and the insulating layer 40.

(e) Electrically connect the N-type electrode 81 to the N-type semiconductor layer 21 and electrically connect the P-type electrode 82 to the anti-diffusion layer 50 to form the semiconductor light emitting chip.

It is worth mentioning that the thickness of each of the substrate 10, the N-type semiconductor layer 21, the active region 22, the P-type semiconductor layer 23, the reflective layer 30, the insulating layer 40, the anti-diffusion layer 50, the N-type extension electrode portion 61, the first isolation portion 71, the N-type electrode 81, and the P-type electrode 82 is merely an example shown in the drawings of the present invention. The actual thickness of each of the substrate 10, the N-type semiconductor layer 21, the active region 22, the P-type semiconductor layer 23, the reflective layer 30, the insulating layer 40, and the anti-diffusion layer 50, the N-type extension electrode portion 61, the first isolation portion 71, the N-type electrode 81, and the P-type electrode 82 should not be limited in the present invention. Furthermore, the actual thickness ratio for the substrate 10, the N-type semiconductor layer 21, the active region 22, the P-type semiconductor layer 23, the reflective layer 30, the insulating layer 40, and the anti-diffusion layer 50, the N-type extension electrode portion 61, the first isolation portion 71, the N-type electrode 81, and the P-type electrode 82 should not be limited in the drawings. In addition, the size ratio of the N-type electrode 81 and the P-type electrode 82 to other layers of the semiconductor light emitting chip also should not be limited as shown in the drawings.

Figure 15A:
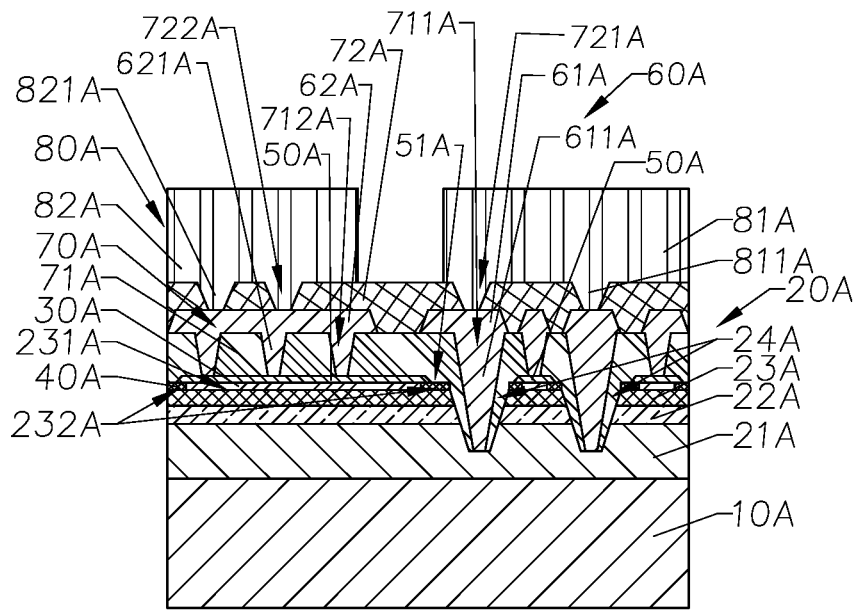
FIG. 15A is a sectional view of the semiconductor light emitting chip according to the above second embodiment of the present invention, illustrating an eighth step of the manufacturing method and the sectional state of the semiconductor light emitting chip.
Figure 15B:
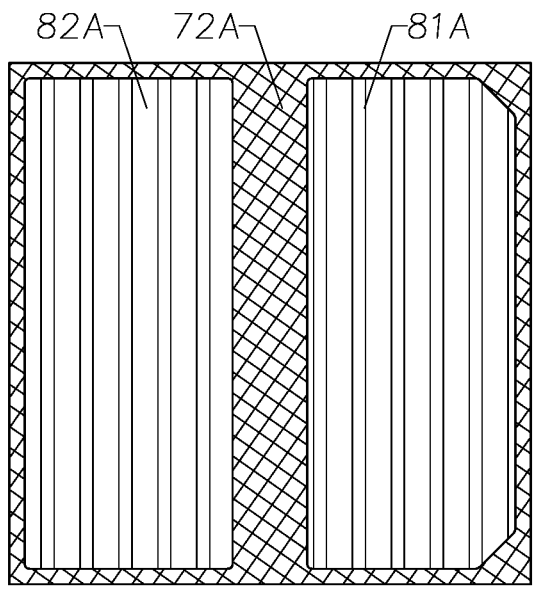
FIG. 15B is a top view of the semiconductor light emitting chip according to the above second embodiment of the present invention, illustrating the eighth step of the manufacturing method and the top state of the semiconductor light emitting chip.

As shown in FIGS. 15A and 15B, a semiconductor light emitting chip according to a second embodiment illustrates an alternative mode of the above embodiment, wherein the semiconductor light emitting chip of the second embodiment comprises a substrate 10A, an epitaxial laminating layer 20A, a reflective layer 30A, at least one insulating layer 40A, an anti-diffusion layer 50A, an extension electrode layer 60A, a galvanic isolation layer 70A, and an electrode set 80A.

FIGS. 8A to 15B illustrate the manufacturing method of the semiconductor light emitting chip of the second embodiment to explain the relationships among the substrate 10A, the epitaxial laminating layer 20A, the reflective layer 30A, the insulating layer 40A, the anti-diffusion layer 50A, the extension electrode layer 60A, the galvanic isolation layer 70A, and the electrode set 80A.

Figure 8A:
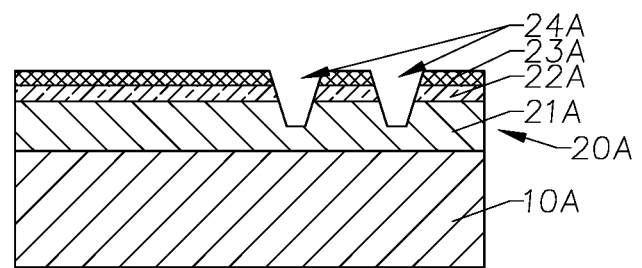
FIG. 8A is a sectional view of a semiconductor light emitting chip according to a second preferred embodiment of the present invention, illustrating a first step of the manufacturing method.
Figure 8B:
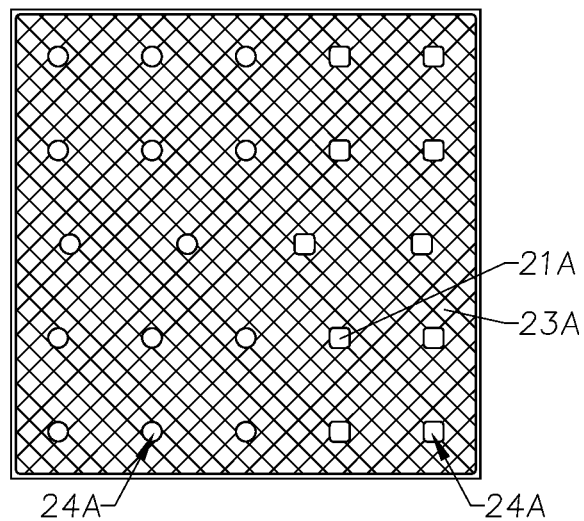
FIG. 8B is a top view of the semiconductor light emitting chip according to the above second embodiment of the present invention, illustrating the first step of the manufacturing method.

As shown in FIGS. 8A and 8B, the epitaxial laminating layer 20A comprises an N-type semiconductor layer 21A, an active region 22A, and a P-type semiconductor layer 23A. The N-type semiconductor layer 21A is developed and formed on the substrate 10A, wherein the N-type semiconductor layer 21A is stacked, preferably laminated, on the substrate 10A. The active region 22A is developed and formed on the N-type semiconductor layer 21A, wherein the active region 22A is stacked, preferably laminated, on the N-type semiconductor layer 21A. The P-type semiconductor layer 23A is developed and formed on the active region 22A, wherein the P-type semiconductor layer 23A is stacked, preferably laminated, on the active region 22A.

Preferably, according to the preferred embodiment as an example of the semiconductor light emitting chip of the present invention, each of the N-type semiconductor layer 21A and the P-type semiconductor layer 23A can be implemented as a gallium nitride layer. In other words, the epitaxial laminating layer 20A comprises an N-type gallium nitride layer overlapped, preferably laminated, on the substrate 10A, and a P-type gallium nitride layer overlapped, preferably laminated, on the active region 22A.

It is worth mentioning that, according to the semiconductor light emitting chip of the present invention, the stacking configuration between the epitaxial laminating layer 20A and the substrate 10A should not be limited. For example, as shown in FIGS. 8A to 8B, the semiconductor light emitting chip can be implemented by Metal-organic Chemical Vapor Deposition (MOCVD) to deposit the N-type semiconductor layer 21A on the substrate 10, to deposit the active region 22A on the N-type semiconductor layer 21A, and to deposit the P-type semiconductor layer 23A on the active region 22A.

It is worth mentioning that the type of the substrate 10A should not be limited in the semiconductor light emitting chip of the present invention. For example, the substrate 10A may be, but not limited to, an aluminum oxide ($Al_2O_3$) substrate, a silicon carbide (SiC) substrate, a silicon (Si) substrate, a gallium nitride (GaN) substrate, a gallium arsenide (GaAs) substrate, and gallium phosphide (GaP) substrate.

As shown in FIGS. 8A and 8B, the epitaxial laminating layer 20A further has at least a semiconductor exposing portion 24A, wherein the semiconductor exposing portion 24A is extended from the P-type semiconductor layer 23A to the N-type semiconductor layer 21A through the active region 22A, such that at least a surface portion of the N-type semiconductor layer 21A is exposed at the semiconductor exposing portion 24A.

Preferably, after the epitaxial laminating layer 20A is formed on the substrate 10A, the semiconductor exposing portion 24A can be formed by etching the epitaxial laminating layer 20A. Specifically, a positive photoresist can be firstly used for forming epitaxial laminating layer 20A on the substrate 10A through photolithography in order to expose an area of the epitaxial laminating layer 20A where it is needed to be etched. The thickness of the photoresist is set to be 3 μm to 5 μm (including 3 μm and 5 μm). Then, after heating up the photoresist, the epitaxial laminating layer 20A is dry-etched by using Inductively Coupled Plasma (ICP). The semiconductor exposing portion 24A of the epitaxial laminating layer 20A is formed and extended from the P-type semiconductor layer 23A to the N-type semiconductor layer 21A through the active region 22A. Finally, the photoresist on the surface of the P-type semiconductor layer 23A is removed. The gas being used in the dry-etching of the epitaxial laminating layer 20A via the Inductively Coupled Plasma machine can be chlorine (Cl2), boron trichloride (BCl3), and argon (Ar). In addition, an etch depth of the epitaxial laminating layer 20A is set between 0.9 μm and 2 μm (including 0.9 μm and 2 μm) when using the Inductively Coupled Plasma machine. In other words, the depth of semiconductor exposing portion 24A of the epitaxial laminating layer 20A is set between 0.9 μm and 2 μm (including 0.9 μm and 2 μm).

According to the preferred embodiment as shown in FIGS. 8A to 15B, a portion of the thickness of the N-type semiconductor layer 21A is also etched with a reduced thickness thereof, such that the semiconductor exposing portion 24A is extended from the P-type semiconductor layer 23A through the active region 22A to a middle portion of the N-type semiconductor layer 21A. Therefore, the thickness of the N-type semiconductor layer 21A corresponding to the semiconductor exposing portion 24A is smaller than the thickness of other portions of the N-type semiconductor layer 21A.

It is worth mentioning that the number and type of the semiconductor exposing portions 24A of the epitaxial laminating layer 20A should not be limited in the semiconductor light emitting chip of the present invention. For example, FIG. 8B illustrates one example of the epitaxial laminating layer 20A and should not be limiting the content and scope of the semiconductor light emitting chip of the present invention.

Figure 9A:
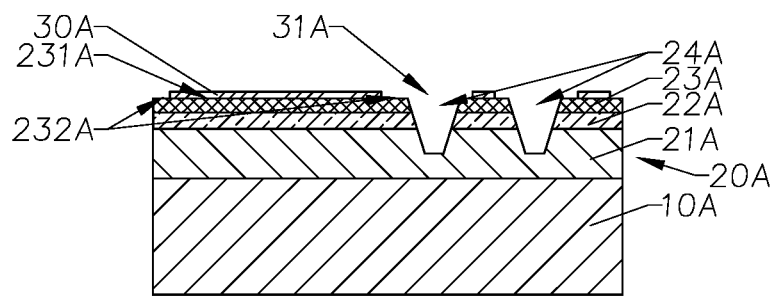
FIG. 9A is a sectional view of the semiconductor light emitting chip according to the above second embodiment of the present invention, illustrating a second step of the manufacturing method.
Figure 9B:
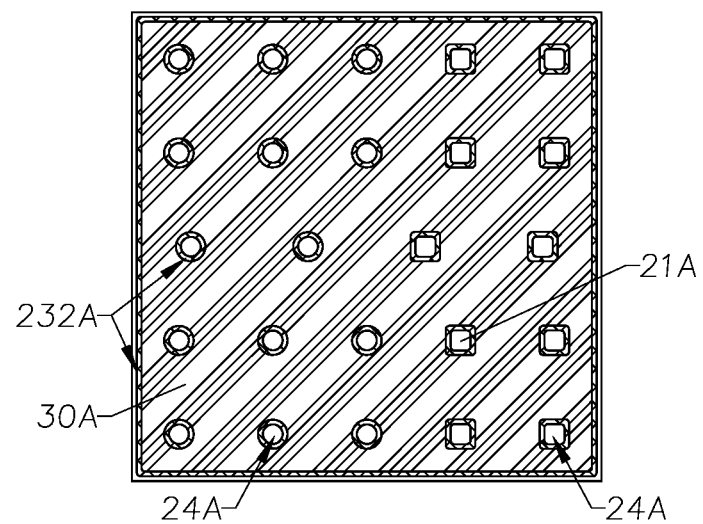
FIG. 9B is a top view of the semiconductor light emitting chip according to the above second embodiment of the present invention, illustrating the second step of the manufacturing method.

As shown in FIGS. 9A and 9B, the reflective layer 30A is formed on, preferably deposited on, the P-type semiconductor layer 23A of the epitaxial laminating layer 20A, such that the reflective layer 30A is arranged to overlap on a part of the surface of the semiconductor layer 23A of the epitaxial laminating layer 20A.

Particularly, a negative photoresist is applied on the surface of the P-type semiconductor layer 23A of the epitaxial laminating layer 20A to etch a desired pattern thereon via photolithography. Then, the reflective layer 30A is deposited on the pattern by vapor deposition or sputter coating. Finally, the negative photoresist is removed. Preferably, the reflective layer 30A is configured with a laminated structure. For example, the reflective layer 30A can be configured with the laminated structure of combination of silver (Ag) and titanium tungsten (TiW). The thickness of the silver layer has a range from 1000 angstroms to 3,000 angstroms (including 1000 angstroms and 3,000 angstroms), and the thickness of the titanium tungsten layer has a range from 200 angstroms to 2,000 angstroms (including 200 angstroms and 2000 angstroms). Preferably, since the reflective layer 30A is deposited on a portion of the surface of the P-type semiconductor layer 23A by vapor deposition or sputtering, it is necessary to use a blue film glass to remove excess metal layer before removing the negative photoresist.

The reflective layer 30A has at least one reflective layer perforation 31A, wherein the semiconductor exposing portion 24A of the epitaxial laminating layer 20A is aligned correspondingly with the reflective layer perforation 31A of the reflective layer 30A, such that the semiconductor exposing portion 24A of the epitaxial laminating layer 20A and the reflective layer perforation 31A of the reflective layer 30A are communicated with each other. Preferably, the shape of the reflective layer perforation 31A of the reflective layer 30 matches with the shape of the semiconductor exposing portion 24A of the epitaxial laminating layer 20A. The size of the reflective layer perforation 31A of the reflective layer 30A is larger than the size of the semiconductor exposing portion 24A of the epitaxial laminating layer 20A. In this manner, after the reflective layer 30A is laminated on the P-type semiconductor layer 23A of the epitaxial laminating layer 20A, a portion of the surface of the P-type semiconductor layer 23A is exposed through the reflective layer perforation 31A of the reflective layer 30A. In addition, the dimension, i.e. the length and width, of the reflective layer 30A is smaller than the dimension of the P-type semiconductor layer 23A of the epitaxial laminating layer 20A. Therefore, after the reflective layer 30A is laminated on the P-type semiconductor layer 23A of the epitaxial laminating layer 20A, the peripheral surface of the epitaxial laminating layer 20A is exposed as it is not covered by the reflective layer 30A.

In other words, the surface of the P-type semiconductor layer 23A of the epitaxial laminating layer 20A has at least a first region 231A and at least two second regions 232A, wherein the two second regions 232A are respectively defined as an outer side and an inner side of any one of the first regions 231A. For example, in one example as shown in FIG. 8B, the surface of the P-type semiconductor layer 23A of the epitaxial laminating layer 20A has one first region 231A and two second regions 232A. One of the second regions 232A is configured to surround the semiconductor exposing portion 24A to form at a middle of the P-type semiconductor layer 23A. Another one of the second regions 232A is formed at a peripheral surface of the P-type semiconductor layer 23A. The first region 231A is formed before the two second regions 232A. The reflective layer 30A is extended from the first region 231A of the P-type semiconductor layer 23A in order to overlap on the P-type semiconductor layer 23A. In other words, one of the second regions 232A of the P-type semiconductor layer 23A is a region of the P-type semiconductor layer 23A being exposed to the reflective layer perforation 31A of the reflective layer 30A. The other second region 232A of the P-type semiconductor layer 23A is a peripheral surface of the P-type semiconductor layer 23A being uncovered by the reflective layer 30A.

Figure 10A:
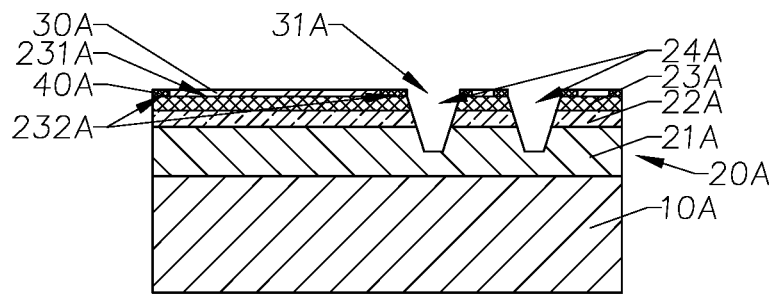
FIG. 10A is a sectional view of the semiconductor light emitting chip according to the above second embodiment of the present invention, illustrating a third step of the manufacturing method.
Figure 10B:
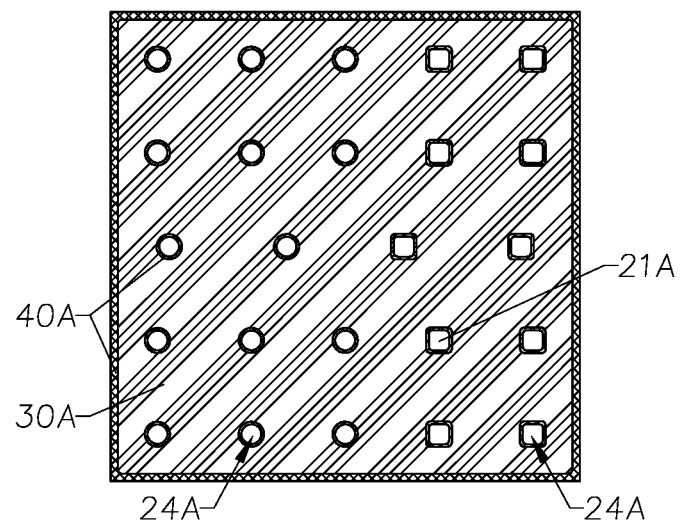
FIG. 10B is a top view of the semiconductor light emitting chip according to the above second embodiment of the present invention, illustrating the third step of the manufacturing method.

As shown in FIGS. 10A and 10B, the insulating layer 40A is extended from at least a portion of the surface of the second region 232A of the P-type semiconductor layer 23A of the epitaxial laminating layer 20A, such that the insulating layer 40A is configured to surround the outer peripheral portion and an inner peripheral portion of the reflective layer 30A. The insulating layer 40A is able to prevent the reflective layer 30A from exhibiting metal migration at the outer peripheral portion and an inner peripheral portion thereof by surrounding the outer peripheral portion and an inner peripheral portion of the reflective layer 30A with the insulating layer 40A, so as to ensure the stability of the reflective layer 30A to further enhance stability of the semiconductor light emitting chip.

Particularly, after the reflective layer 30A is deposited at the first region 231A of the P-type semiconductor layer 23A of the epitaxial laminating layer 20A, the insulating layer 40A is deposited on at least a portion of the surface of the second region 232A of the P-type semiconductor layer 23A by vapor deposition, sputtering, or plasma enhanced chemical Vapor Deposition (PECVD), such that the outer peripheral portion and an inner peripheral portion of the reflective layer 30A are surrounded by the insulating layer 40A. Preferably, the insulating layer 40A is laminated on the entire area of the second region 232A of the P-type semiconductor layer 23A. It is worth mentioning that the insulating layer 40A can further cover at least a portion of the surface of the reflective layer 30A. Preferably, the insulating layer 40A can be fabricated by using, but not limited to, negative adhesive remover or positive gel etching.

Preferably, the material of the insulating layer 40A can be silicon dioxide ($SiO_2$) such that the insulating layer 40A forms a silicon dioxide layer to surround the outer peripheral portion and the inner peripheral portion of the reflective layer 30A. Preferably, the thickness of the insulating layer 40A has a range from 100 angstroms to 5,000 angstroms (including 100 angstroms and 5000 angstroms).

It is worth mentioning that, in the example shown in FIGS. 10A and 10B, the thickness of the insulating layer 40A is the same as the thickness of the reflective layer 30A. However, it should be understood by those skilled in the art that in other possible examples of the semiconductor light emitting chip of the present invention, the thickness of the insulating layer 40A can be greater than the thickness of the reflective layer 30A. Therefore, the insulating layer 40A is elevated above the reflective layer 30A. Likewise, the thickness of the insulating layer 40A can be smaller than the thickness of the reflective layer 30A, such that the insulating layer 40A is lower than the reflective layer 30A.

Figure 11A:
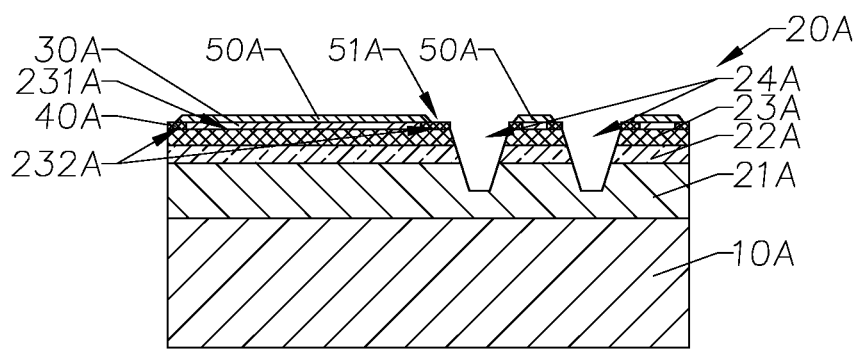
FIG. 11A is a sectional view of the semiconductor light emitting chip according to the above second embodiment of the present invention, illustrating a fourth step of the manufacturing method.
Figure 11B:
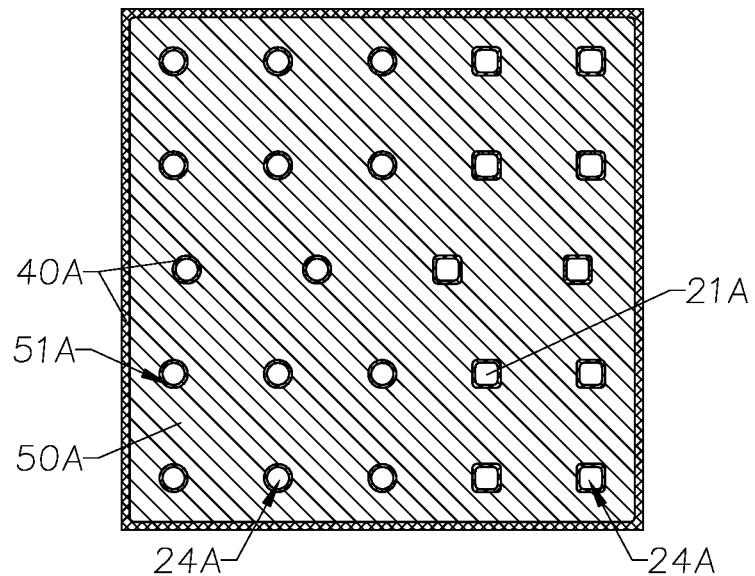
FIG. 11B is a top view of the semiconductor light emitting chip according to the above second embodiment of the present invention, illustrating the fourth step of the manufacturing method.

As shown in FIGS. 11A and 11B, the anti-diffusion layer 50A is deposited on the reflective layer 30A and the insulating layer 40A, such that the anti-diffusion layer 50A is laminated on the reflective layer 30A and the insulating layer 40A. The anti-diffusion layer 50A can prevent the metal migration on the surface of the reflective layer 30A by laminating the anti-diffusion layer 50A on the surface of the reflective layer 30A. It is because the insulating layer 40A is configured to surround the outer peripheral portion and the inner peripheral portion of the reflective layer 30A to prevent the reflective layer 30A from being metal migration to the outer peripheral portion and the inner peripheral portion of the insulating layer 40A. Thus, the anti-diffusion layer 50A is laminated on the surface of the reflective layer 30A to prevent the metal migration on the surface of the reflective layer 30A by the anti-diffusion layer 50A. Therefore, the reflective layer 30A is coated by the insulating layer 40A and the anti-diffusion layer 50A at the same time to prevent the occurrence of metal migration to ensure the stability of the reflective layer 30A, so as to enhance the stability of the semiconductor light emitting chip.

Since the anti-diffusion layer 50A is laminated on the reflective layer 30A and the insulating layer 40A, the insulating layer 40A can isolate the anti-diffusion layer 50A and the P-type semiconductor layer 23A, such that the insulating layer 40A is configured to prevent the anti-diffusion layer 50A from directly contacting with the P-type semiconductor layer 23A. Through this configuration, it can avoid an abnormal electrostatic punctuation caused by current accumulation of the semiconductor light emitting chip after being de-energized so as to ensure reliability of the semiconductor light-emitting chip during the operation.

The anti-diffusion layer 50A has at least one anti-diffusion layer perforation 51A, wherein the semiconductor exposing portion 24A of the epitaxial laminating layer 20A is aligned corresponding to the anti-diffusion layer perforation 51A of the anti-diffusion layer 50A, such that semiconductor exposing portion 24A of the epitaxial laminating layer 20A and the anti-diffusion layer perforation 51A of the anti-diffusion layer 50A are communicatively connected with each other. Preferably, the shape of the anti-diffusion layer perforation 51A of the anti-diffusion layer 50A is identical to the shape of the semiconductor exposing portion 24A of the epitaxial laminating layer 20A.

Preferably, the anti-diffusion layer perforation 51A of the anti-diffusion layer 50A is developed and formed at the same time when the diffusion prevention layer 50A is developed and formed on the reflective layer 30A and the insulating layer 40A. Particularly, a negative photoresist is applied on a surface of an outer peripheral portion of the anti-diffusion layer 50A to etch a desired pattern thereon via photolithography. Then, the anti-diffusion layer 50A is deposited on the pattern by vapor deposition or sputter coating, such that the anti-diffusion layer 50A is laminated on the inner peripheral surfaces of the reflective layer 30 and the insulating layer 40A. Then, blue film is used to remove excess metal layer before removing the negative photoresist. Finally, the photoresist layer on the surface of the insulating layer 40A is removed to form the anti-diffusion layer perforation 51A of the diffusion prevention layer 50A.

Preferably, the anti-diffusion layer 50A is configured to have a laminated structure. For example, the laminated structure of the diffusion prevention layer 50A is a combination of titanium tungsten (TiW) and platinum (Pt).

Figure 12A:
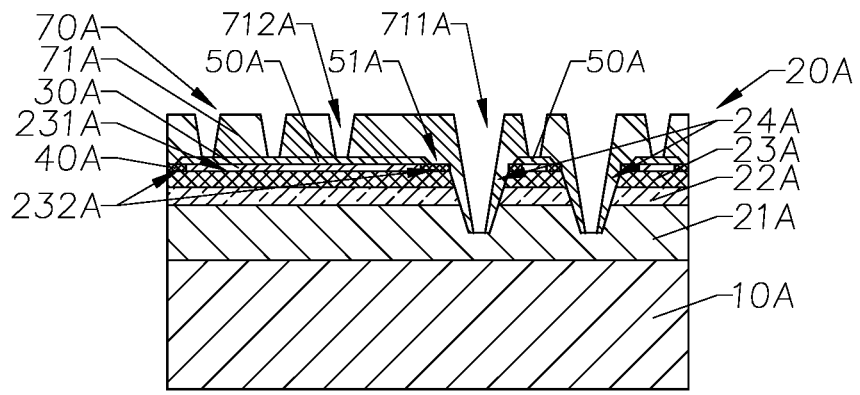
FIG. 12A is a sectional view of the semiconductor light emitting chip according to the above second embodiment of the present invention, illustrating a fifth step of the manufacturing method.
Figure 12B:
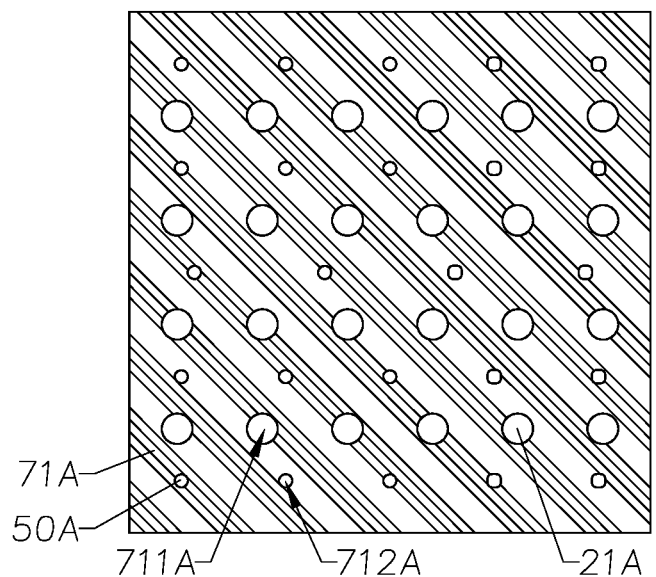
FIG. 12B is a top view of the semiconductor light emitting chip according to the above second embodiment of the present invention, illustrating the fifth step of the manufacturing method.

As shown in FIGS. 12A and 12B, the galvanic isolation layer 70A has a first isolation portion 71A. The first isolation portion 71A is formed on the insulating layer 40A, the diffusion prevention layer 50A, and the epitaxial laminating layer 20A. In other words, the first isolation portion 71A is sequentially extended through the anti-diffusion layer perforation 51A of the anti-diffusion layer 50A and the semiconductor exposing portion 24A of the epitaxial laminating layer 20A to the N-type semiconductor layer 21A. Accordingly, the first isolation portion 71A has at least one first channel 711A and at least one second channel 712A, wherein the first channel 711A is extended to the N-type semiconductor layer 21A to expose at least a portion of the N-type semiconductor layer 21A through the first channel 711A. The second channel 712A is extended to the anti-diffusion layer 50A to expose at least a portion of the anti-diffusion layer 50A through the second channel 712A.

Particularly, a first isolation base layer is initially developed and deposited on the insulating layer 40A, the anti-diffusion layer 50A, and the epitaxial laminating layer 20A, wherein the first isolation base layer is sequentially extended through the anti-diffusion layer perforation 51A of the anti-diffusion layer 50A and the semiconductor exposing portion 24A of the epitaxial laminating layer 20A to the N-type semiconductor layer 21A. Then, an etching position of the first isolation base layer is determined via photoresist lithography, wherein the first isolation base layer is then etched by using Inductively Coupled Plasma (ICP). Therefore, the first channel 711A is formed and extended to the N-type semiconductor layer 21A of the epitaxial laminating layer 20A while the second channel 712A is formed and extended to the anti-diffusion layer 50A. Accordingly, the first isolation substrate layer is arranged to form the first isolation portion 71A once the first channel 711A and the second channel 712A are formed.

Preferably, the first isolation portion 71A is a distributed via Bragg Reflection (DBR), wherein the first isolation portion 71 is made of silicon oxide and titanium oxide in an overlapping structure. Accordingly, the first isolation portion 71A is configured and designed with different reflective layer pairs for different wavelengths. For example, in one example of the semiconductor light emitting chip of the present invention, the reflective layer pairs of the first isolation portion 71A have a logarithm range of 20 to 50 (including 20 pairs and 50 pairs).

Figure 13A:
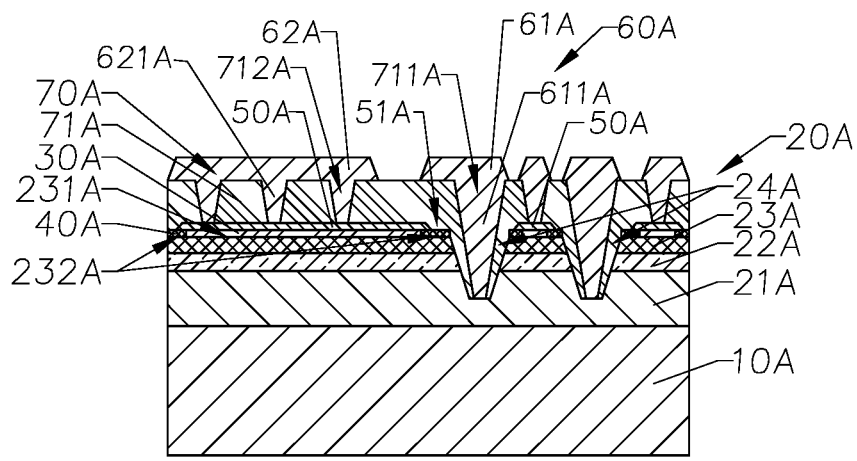
FIG. 13A is a sectional view of the semiconductor light emitting chip according to the above second embodiment of the present invention, illustrating a sixth step of the manufacturing method.
Figure 13B:
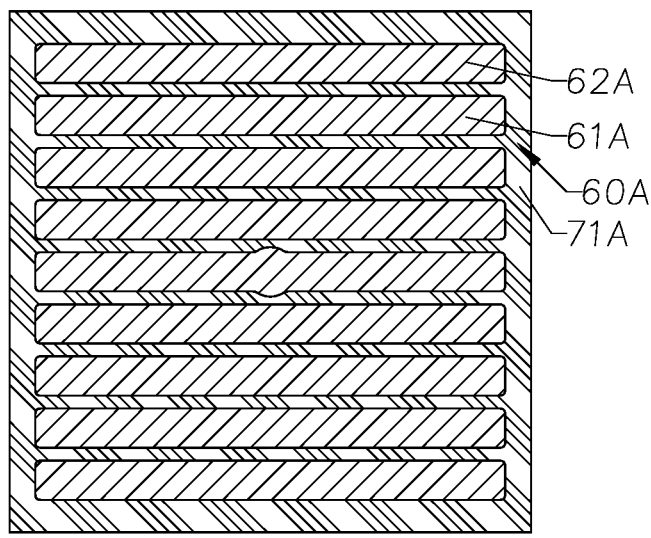
FIG. 13B is a top view of the semiconductor light emitting chip according to the above second embodiment of the present invention, illustrating the sixth step of the manufacturing method.

As shown in FIGS. 13A and 13B, the extension electrode layer 60A has at least one N-type extension electrode portion 61A and at least one P-type extension electrode portion 62A, wherein the N-type extension electrode portion 61A and the P-type extension electrode portion 62A are respectively stacked on the first isolation portion 71A in an alternating manner. Thus, the N-type extension electrode portion 61A is extended to the N-type semiconductor layer 21A of the epitaxial laminating layer 20A through the first channel 711A of the first isolation portion 71A. The P-type extension electrode portion 62A is extended to the anti-diffusion layer 50A through the second channel 712A of the first isolation portion 71A.

Particularly, the N-type extension electrode portion 61A has at least one N-type extension electrode terminal 611A having a pin shape, wherein when the N-type extension electrode portion 61A is laminated on the first isolation portion 71A, the N-type extension electrode terminal 611A is formed and retained at the first channel 711A of the first isolation portion 71A, such that the N-type extension electrode portion 61A is extended to the N-type semiconductor layer 21A of the epitaxial laminating layer 20A through the first channel 711A of the first isolation portion 71A. Correspondingly, the P-type extension electrode portion 62A has at least one P-type extension electrode terminal 621A having a pin shape, wherein when the P-type extension electrode terminal 621A is laminated on the first isolation portion 71A, the P-type extension electrode pin 621A is formed and retained at the second channel 712A of the first isolation portion 71A, such that the P-type extension electrode portion 62A is extended to the anti-diffusion layer 50A through the second channel 712A of the first isolation portion 71A.

The N-type extension electrode portion 61A and the P-type extension electrode portion 62A are laminated on the first isolation portion 71A by means of negative adhesive removing method. Particularly, a negative photoresist is applied at the first isolation portion 71A to etch a desired pattern thereon via photolithography in order for depositing and forming the N-type extension electrode portion 61A and the P-type extension electrode portion 62A. Then, the N-type extension electrode terminal 611A of the N-type extension electrode portion 61A is retained at the first channel 711A of the first isolation portion 71A and is extended to the N-type semiconductor layer 21A of the epitaxial laminating layer 20A through the first channel 711A. The P-type extension electrode terminal 621A of the P-type extension electrode portion 62A is retained at the second channel 712A of the first isolation portion 71A and is extended to the anti-diffusion layer 50A through the second channel 712A.

Preferably, the N-type extension electrode portion 61A and the P-type extension electrode portion 61A are reflection-extension electrode portions adapted for reflecting light generated by the active region 22A. Preferably, the material of each of the N-type extension electrode portion 61A and the P-type extension electrode portion 61A is selected from a group consisting of chromium (Cr), aluminum (Al), titanium (Ti), platinum (Pt), and gold (Au). Therefore, each of the N-type extension electrode portion 61A and the P-type extension electrode portion 61A has a light reflecting function to reflect the light generated by the active region 22A.

Figure 14A:
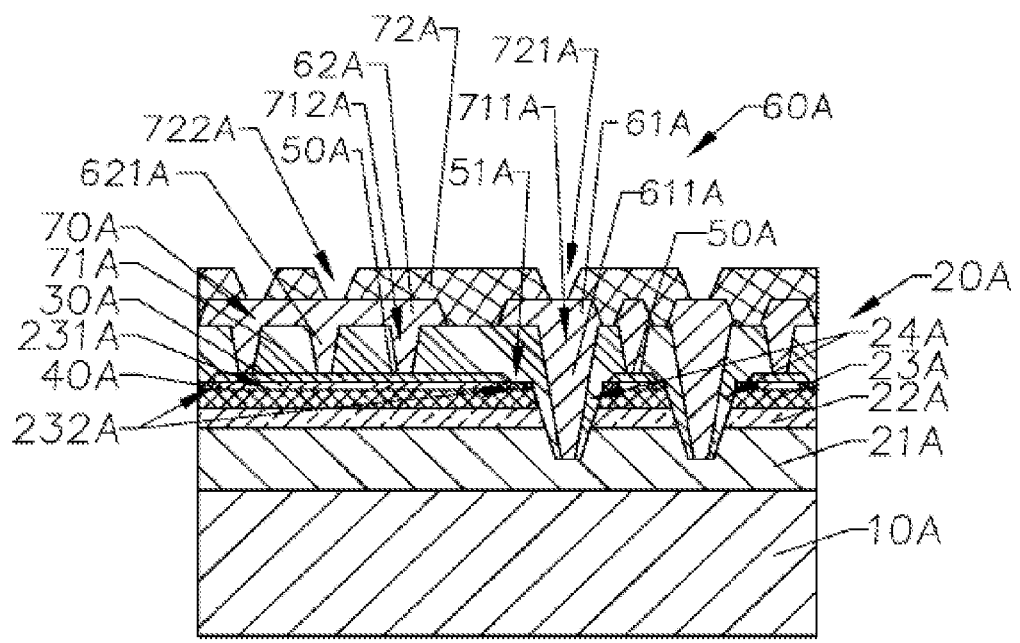
FIG. 14A is a sectional view of the semiconductor light emitting chip according to the above second embodiment of the present invention, illustrating a sixth step of the manufacturing method.
Figure 14B:
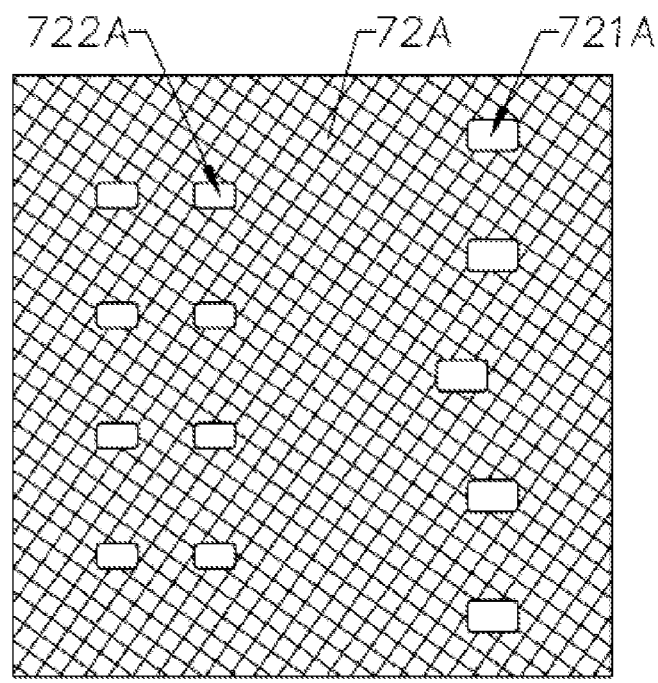
FIG. 14B is a top view of the semiconductor light emitting chip according to the above second embodiment of the present invention, illustrating the sixth step of the manufacturing method.

As shown in FIGS. 14A and 14B, the galvanic isolation layer 70A further has a second isolation portion 72A, wherein the second isolation portion 72A is developed and formed on the N-type extension electrode portion 61A, the P-type extension electrode portion 62A, and the first isolation portion 71A. In other words, the second isolation portion 72A is filled in a gap formed between the N-type extension electrode portion 61A and the P-type extension electrode portion 62A. The second isolation portion 72A has at least one third channel 721A and at least one fourth channel 722A, wherein the third channel 721A is extended to the N-type extended electrode portion 61A, such that at least a portion of the surface of the N-type extension electrode portion 61A is exposed through the third channel 721A. The fourth channel 722A is extended to the P-type extension electrode portion 62A, such that at least a portion of the surface of the P-type extension electrode portion 62A is exposed through the fourth channel 722A.

Particularly, a second isolation base layer is initially developed and deposited on the N-type extension electrode portion 61A, the P-type extension electrode portion 62A, and the first isolation portion 71A, wherein the second isolation base layer is filled in a gap formed between the N-type extension electrode portion 61A and the P-type extension electrode portion 62A. Then, an etching position of the second isolation base layer is determined via photoresist lithography, wherein the first isolation base layer is then etched by using dry-etching. Therefore, the third channel 721A is formed and extended to the N-type extension electrode portion 61A while the fourth channel 722A is formed and extended to the P-type extension electrode portion 62A. Preferably, the second isolation base layer is developed and formed on the N-type extension electrode portion 61A, the P-type extension electrode portion 62A, and the first isolation portion 71A by means of Plasma Enhanced Chemical Vapor Deposition (PECVD). The gas used for depositing the second isolation base layer by means of Plasma Enhanced Chemical Vapor Deposition (PECVD) can be silane ($SiH_4$), nitrous oxide ($N_2O$) and nitrogen ($N_2$), wherein the thickness of the second isolation base layer has a range from 5,000 angstroms to 20,000 angstroms (including 5000 angstroms and 20,000 angstroms).

As shown in FIGS. 15A and 15B, the electrode set 80A comprises an N-type electrode 81 and a P-type electrode 82, wherein the N-type electrode 81A and the P-type electrode 82A are stacked on the second isolation portion 72A in an alternating manner. Furthermore, the N-type electrode 81 is extended through the third channel 721A of the second isolation portion 72A to the N-type extension electrode portion 61A, and the P-type electrode 82A is extended through the fourth channel 722A of the second isolation portion 72A to the P-type extension electrode portion 62A.

Particularly, the N-type electrode 81A further has at least one N-type electrode connection terminal 811A having a pin shape, wherein when the N-type electrode 81A is laminated on the second isolation portion 72A, the N-type electrode connecting terminal 811A is formed and retained at the third channel 721A of the second isolation portion 72A, such that the N-type electrode connection terminal 811A of the N-type electrode 81A is extended to the N-type extension electrode portion 61A through the third channel 721A of the second isolation portion 72A. Correspondingly, the P-type electrode 82A further has at least one P-type electrode connection terminal 821A having a pin shape, wherein when the P-type electrode 82A is laminated on the second isolation portion 72A, the P-type electrode connection terminal 821A is formed and retained at the fourth channel 722A of the second isolation portion 72A, such that the P-type electrode connection terminal 821A of the P-type electrode 82A is extended to the P-type extension electrode portion 62A through the fourth channel 722A of the second isolation portion 72A.

Preferably, the thickness of each of the N-type electrode 81A and the P-type electrode 82A has a range from 1 μm to 5 μm (including 1 μm and 5 μm), wherein the thickness of the N-type electrode 81A refers to the thickness of a main body portion of the N-type electrode 81A. In other words, the thickness of the N-type electrode 81A should not be counted by an extension length of the N-type electrode connection terminal 811A. Correspondingly, the thickness of the P-type electrode 82A refers to the thickness of a main body portion of the P-type electrode 82A. In other words, the thickness of the P-type electrode 82A should not be counted by an extension length of the P-type electrode connection terminal 821A.

The N-type electrode 81A and the P-type electrode 82A are laminated on the second isolation portion 72A by means of a negative adhesive removing method. Particularly, a negative photoresist is applied on the second isolation portion 72A to etch a desired pattern thereon via photolithography for forming the N-type electrode 81A and the P-type electrode 82A. Then, the N-type electrode 81A and the P-type electrode 82A are deposited on the pattern by vapor deposition or sputtering. Therefore, the N-type electrode connection terminal 811A of the N-type electrode 81A is held at the third channel 721A of the second isolation portion 72A and is extended through the third channel 721A to the N-type extension electrode portion 61A. At the same time, the P-type electrode connection terminal 821A of the P-type electrode 82A is held at the fourth channel 722A of the second isolation portion 72A and is extended through the fourth channel 722A to the P-type extension electrode portion 62A. Then, blue film is used to remove excess metal layer before removing the negative photoresist. Finally, the photoresist layer is removed to form the N-type electrode 81A and the P-type electrode 82A. Preferably, the N-type electrode 81A and the P-type electrode 82A are reflective electrodes adapted for reflecting light generated by the active region 22A. Optionally, the N-type electrode 81A and the P-type electrode 82A is made of material selected from a group consisting of chromium (Cr), aluminum (Al), titanium (Ti), platinum (Pt), and gold (Au). The N-type electrode 81A and the P-type electrode 82A should be made of the material having a function of reflecting light generated by the active region 22A.

Accordingly, the method of manufacturing the semiconductor light emitting chip, according to the second embodiment, comprises the following steps.

(f) Sequentially develop and form the N-type semiconductor layer 21A, the active region 22A, and the P-type semiconductor layer 23A on the substrate 10A.

(g) Laminate the reflective layer 30A on a portion of the surface of the P-type semiconductor layer 23A.

(h) Extend the insulating layer 40A to surround the inner peripheral portion and the outer peripheral portion of the reflective layer 30A respectively.

(i) Develop the anti-diffusion layer 50A from the reflective layer 30A and the insulating layer 40A.

(j) Electrically connect the N-type electrode 81A to the N-type semiconductor layer 21A and electrically connect the P-type electrode 82A to the anti-diffusion layer 50A to form the semiconductor light emitting chip.

It is worth mentioning that the insulating layer 40A is extended from the P-type semiconductor layer 23A to surround the inner peripheral portion and the outer peripheral portion of the reflective layer 30A respectively as shown in FIGS. 8A to 15B. However, it should be understood by those skilled in the art that, in other possible examples of the manufacturing method of the semiconductor light emitting chip of the present invention, the insulating layer 40A can be developed and extended from the active region 22A, the N-type semiconductor layer 21A, or the substrate 10A. In other words, the developing position of the insulating layer 40A should not be limited in the manufacturing method of the semiconductor light emitting chip of the present invention. The insulating layer 40A is only required to surround the inner peripheral portion and the outer peripheral portion of the reflective layer 30A and to isolate the anti-diffusion layer 50A from the P-type semiconductor layer 23A.

It is worth mentioning that the thickness of each of the substrate 10A, the N-type semiconductor layer 21A, the active region 22A, the P-type semiconductor layer 23A, the reflective layer 30A, the insulating layer 40A, the anti-diffusion layer 50A, the N-type extension electrode portion 61A, the P-type extension electrode portion 62A, the first isolation portion 71A, the second isolation portion 72A, the N-type electrode 81A, and the P-type electrode 82A is merely an example shown in the drawings of the present invention. The actual thickness of each of the substrate 10A, the N-type semiconductor layer 21A, the active region 22A, the P-type semiconductor layer 23A, the reflective layer 30A, the insulating layer 40A, and the anti-diffusion layer 50A, the N-type extension electrode portion 61A, the P-type extension electrode portion 62A, the first isolation portion 71A, the second isolation portion 72A, the N-type electrode 81A, and the P-type electrode 82A should not be limited in the present invention. Furthermore, the actual thickness ratio for the substrate 10A, the N-type semiconductor layer 21A, the active region 22A, the P-type semiconductor layer 23A, the reflective layer 30A, the insulating layer 40A, and the anti-diffusion layer 50A, the N-type extension electrode portion 61A, the P-type extension electrode portion 62A, the first isolation portion 71A, the second isolation portion 72A, the N-type electrode 81A, and the P-type electrode 82A should not be limited in the drawings. In addition, the size ratio of the N-type electrode 81A and the P-type electrode 82A to other layers of the semiconductor light emitting chip also should not be limited as shown in the drawings.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A semiconductor light emitting chip, comprising:
a substrate;

an epitaxial laminating layer which comprises an N-type gallium nitride layer, an active region, and a P-type gallium nitride layer, wherein said substrate, said N-type gallium nitride layer, said active region, and said P-type gallium nitride layer are sequentially overlapped with each other;

at least a reflective layer laminated on a portion of a surface of said P-type gallium nitride layer;

at least two insulating layers, one of said insulating layers laminated on said P-type gallium nitride layer to surround at an inner peripheral portion of said reflective layer while another said insulating layer laminated on said P-type gallium nitride layer to surround at an outer peripheral portion of said reflective layer;

at least one anti-diffusion layer laminated on said reflective layer and said at least two insulating layers in such a manner that said at least two insulating layers isolate said at least one anti-diffusion layer and said P-type gallium nitride layer, such that said at least two insulating layers are configured to prevent said at least one anti-diffusion layer from directly contacting with said P-type gallium nitride layer;

an electrode set which comprises an N-type electrode and a P-type electrode, wherein said N-type electrode is electrically connected to said N-type gallium nitride layer of aid epitaxial laminating layer while said P-type electrode is electrically connected to said anti-diffusion layer; and an isolation layer having a first isolation portion extended through said at least one anti-diffusion layer and a semiconductor exposing portion of said epitaxial laminating layer to said N-type gallium nitride layer in order to laminate on said at least one anti-diffusion layer, wherein said first isolation portion has at least one first channel and at least one second channel, wherein said at least one first channel is extended to at least one N-type extension electrode portion, wherein said N-type electrode is electrically connected to said at least one N-type extension electrode portion through said at least one first channel, wherein said at least one second channel is extended to said at least one anti-diffusion layer, wherein said P-type electrode is electrically connected to said at least one anti-diffusion layer through said at least one second channel.

2. The semiconductor light emitting chip, as recited in claim 1, wherein said epitaxial laminating layer has said semiconductor exposing portion, wherein said semiconductor exposing portion is extended from said P-type gallium nitride layer to said N-type gallium nitride layer through said active region, wherein said at least one anti-diffusion layer has at least one anti-diffusion layer perforation, wherein said semiconductor exposing portion of said epitaxial laminating layer is aligned correspondingly to said at least one anti-diffusion layer perforation of said at least one anti-diffusion layer, wherein said N-type electrode is sequentially extended through said at least one anti-diffusion layer perforation of said at least one anti-diffusion layer and said semiconductor exposing portion of said epitaxial overlapping in order to electrically connect to said N-type gallium nitride layer.

3. The semiconductor light emitting chip, as recited in claim 2, further comprising an extension electrode layer having said at least one N-type extension electrode portion laminated on said N-type gallium nitride layer to be retained at said semiconductor exposing portion of said epitaxial exposing layer, wherein said N-type electrode is electrically connected to said N extension electrode portion.

4. The semiconductor light emitting chip, as recited in claim 1, wherein said first isolation portion is further laminated on said at least two insulating layers.

5. The semiconductor light emitting chip, as recited in claim 1, wherein said first isolation portion is further laminated on said at least one N-type extension electrode portion.

6. The semiconductor light emitting chip, as recited in claim 1, wherein said N-type electrode has at least one N-type electrode connection terminal, wherein when said N-type electrode is laminated on said first isolation portion, said N-type electrode connecting terminal is formed on and retained at said at least one first channel of said first isolation portion, such that said N-type electrode connection terminal is extended to and electrically connected to said N-type extension electrode portion, correspondingly, said P-type electrode further has at least one P-type electrode connection terminal, wherein when said P-type electrode is laminated on said first isolation portion, said P-type electrode connection terminal is formed and retained at said at least one second channel of said first isolation portion, such that said P-type electrode connection terminal is extended to and electrically connected to said at least one anti-diffusion layer.

7. The semiconductor light emitting chip, as recited in claim 2, further comprising an isolation layer having a first isolation portion extended through said at least one anti-diffusion layer perforation of said at least one anti-diffusion layer and said semiconductor exposing portion of said epitaxial laminating layer to said N-type gallium nitride layer in order to laminate on said at least one anti-diffusion layer, wherein said first isolation portion has at least one first channel and at least one second channel, wherein said at least one first channel is extended to said N-type gallium nitride layer, wherein said N-type electrode is electrically connected to said N-type gallium nitride layer through said at least one first channel, wherein said at least one second channel is extended to said P-type gallium nitride layer, wherein said P-type electrode is electrically connected to said at least one anti-diffusion layer through said at least one second channel.

8. The semiconductor light emitting chip, as recited in claim 7, wherein said first isolation portion is further laminated said at least two insulating layers.

9. The semiconductor light emitting chip, as recited in claim 8, further comprising an extension electrode layer, wherein said extension electrode layer has at least one N-type extension electrode portion and at least one P-type extension electrode portion, wherein said at least one N-type extension electrode portion and said at least one P-type extension electrode portion are respectively stacked on said first isolation portion in an alternating manner, wherein said N-type extended electrode portion has at least one N-type extended electrode terminal extended through said at least one first channel of said first isolation portion to electrical connect to said N-type gallium nitride layer, wherein said at least one P-type extension electrode portion has at least one P-type extension electrode terminal and is extended through said at least one second channel of said first isolation portion to electrically connect to said P-type gallium nitride layer.

10. The semiconductor light emitting chip, as recited in claim 9, wherein said isolation layer further comprise a second isolation portion, wherein said second isolation portion is laminated on said at least one N-type extension electrode portion, said first isolation portion, and said at least one P-type extension electrode portion, wherein said second isolation portion has at least one third channel and at least one fourth channel, wherein said at least one third channel is extended to said at least one N-type extension electrode portion, wherein said N-type electrode is electrically connected to said at least one N-type extension electrode portion through said at least one third channel, wherein said at least one fourth channel is extended to said at least one P-type extension electrode portion, wherein said P-type electrode is electrically connected to said at least one P-type extension electrode portion through said at least one fourth channel.

11. The semiconductor light emitting chip, as recited in claim 10, wherein said N-type electrode has at least one N-type extension connection terminal, wherein when said N-type electrode is stacked on said second isolation portion, said at least one N-type electrode connection terminal is formed at and retained at said at least one third channel of said second isolation portion, wherein said at least one N-type electrode connection terminal is extended to and is electrically connected to said at least one N-type electrode connection portion, correspondingly, said P-type electrode has at least one P-type electrode connection terminal, wherein when said P-type electrode is stacked on said second isolation portion, said at least one P-type electrode connection terminal is formed at and retained at said at least one fourth channel of said second isolation portion, wherein said at least one P-type electrode connection terminal is extended to and is electrically connected to said at least one P-type extension electrode portion.

12. The semiconductor light emitting chip, as recited in claim 11, wherein a thickness of said reflective layer is the same as a thickness of each of said at least two insulating layers.

13. The semiconductor light emitting chip, as recited in claim 11, wherein each of said at least two insulating layers is made of silicon dioxide.

14. The semiconductor light emitting chip, as recited in claim 11, wherein a thickness of each of said at least two insulating layers has a range from 100 angstroms to 5,000 angstroms.

15. A method of manufacturing a semiconductor light emitting chip, which comprises the comprising steps of:
(a) sequentially developing a N-type gallium nitride layer, an active region, and a P-type gallium nitride layer on a substrate;
(b) laminating a reflective layer on a portion of a surface of said P-type gallium nitride layer;
(c) extending an insulating layer to surround an inner peripheral portion and an outer peripheral portion of said reflective layer respectively;
(d) developing an anti-diffusion layer from said reflective layer to said and an insulating layer such that said insulating layer isolates said anti-diffusion layer and said P-type gallium nitride layer, wherein said insulating layer is configured to prevent said anti-diffusion layer from directly contacting with said P-type gallium nitride layer;
(d1) developing a first isolation portion to said anti-diffusion layer, wherein said first isolation portion is extended through said anti-diffusion layer and a semiconductor exposing portion to said N-type gallium nitride layer, wherein said first isolation portion has at least one first channel and at least one second channel, wherein said at least one first channel is extended to said at least one N-type extension electrode portion, wherein a N-type electrode is electrically connected to said at least one N-type extension electrode portion through said at least one first channel, wherein said at least one second channel is extended to said anti-diffusion layer, wherein a P-type electrode is electrically connected to said anti-diffusion layer through said at least one second channel; and
(e) electrically connecting said N-type electrode to said N-type gallium nitride layer and electrically connect said P-type electrode to said anti-diffusion layer to form said semiconductor light emitting chip.

16. The method as recited in claim 15 wherein, in the step (c), said insulating layer is developed from said P-type gallium nitride layer to surround said reflective layer.

17. The method as recited in claim 15 wherein, in the step (c), said insulating layer is developed from said active region to surround said reflective layer.

18. The method as recited in claim 15 wherein, in the step (c), said insulating layer is developed from said N-type gallium nitride layer to surround said reflective layer.

19. The method as recited in claim 15 wherein, in the step (c), said insulating layer is developed from said substrate to surround said reflective layer.

20. The method as recited in claim 15, before the step (c), further comprising a step of: etching said P-type gallium nitride layer and said active region in sequence to form at least one semiconductor exposing portion extended from said P-type gallium nitride layer through said active region to said N-type gallium nitride layer, wherein in the step (d), at least one anti-diffusion layer perforation is formed when said anti-diffusion layer is developed on said reflective layer and said insulating layer, wherein said semiconductor exposing portion is aligned correspondingly to said at least one anti-diffusion layer perforation, wherein in the step (e), said N-type electrode is allowed to be sequentially extended through said anti-diffusion layer and said at least one semiconductor exposing portion in order to electrically connect to said N-type gallium nitride layer.

21. The method as recited in claim 16, before the step (c), further comprising a step of: etching said P-type gallium nitride layer, said active region, and said N-type gallium nitride layer in sequence to form at least one semiconductor exposing portion extended from P-type gallium nitride layer through said active region to said N-type gallium nitride layer, wherein in the step (d), at least one anti-diffusion layer perforation is formed when said anti-diffusion layer is developed on said reflective layer and said insulating layer, wherein said semiconductor exposing portion is aligned correspondingly to said at least one anti-diffusion layer perforation, wherein in the step (e), said N-type electrode is allowed to be sequentially extended through said anti-diffusion layer and said at least one semiconductor exposing portion in order to electrically connect to said N-type gallium nitride layer.

22. The method as recited in claim 21, before the step (e), further comprising a step of: developing said at least one N-type extension electrode portion on said N-type gallium nitride layer, wherein in the step (e), said N-type electrode is electrically connected to said N-type gallium nitride layer so as to electrically connect to said at least one N-type extension electrode portion.

23. The method as recited in claim 15, wherein in the step of developing said first isolation portion in said anti-diffusion layer, further comprises steps of:
developing a first isolation base layer to said anti-diffusion layer; and
etching said first isolation base layer to form said at least one first channel extended to said at least one N-type extension electrode portion and said at least one second channel extended to said anti-diffusion layer, wherein said first isolation base layer is formed as said first isolation portion.

24. The method, as recited in claim 15, wherein said first isolation portion is laminated on said insulating layer.

25. The method, as recited in claim 24, wherein said first isolation portion is laminated on said at least one N-type extension electrode portion.

26. The method as recited in claim 21, wherein the step (e) further comprises steps of:
- (e.1) developing said N-type electrode from said first isolation portion, wherein in a developing process of said N-type electrode, an N-type electrode connection terminal of said N-type electrode is formed at said at least one first channel of said first isolation portion and is electrically connected to said at least one N-type extension electrode portion through said at least one first channel; and
- (e.2) developing said P-type electrode from said first isolation portion, wherein in a developing process of said P-type electrode, a P-type electrode connection terminal of said P-type electrode is formed at said at least one second channel of said first isolation portion and is electrically connected to said anti-diffusion layer through said at least one second channel.

27. The method as recited in claim 22, before the step (e), further comprising a step of: developing a first isolation portion to said anti-diffusion layer, wherein said first isolation portion is extended through said anti-diffusion layer and said semiconductor exposed portion to said N-type gallium nitride layer, wherein said first isolation portion has at least one first channel and at least one second channel, wherein said first channel is extended to said N-type gallium nitride layer, wherein said N-type electrode is electrically connected to said N-type gallium nitride layer through said at least one first channel, wherein said at least one second channel is extended to said anti-diffusion layer, wherein said P-type electrode is electrically connected to said anti-diffusion layer through said at least one second channel.

28. The method as recited in claim 27, in the step of developing said first isolation portion on said anti-diffusion layer, further comprising steps of:
- developing a first isolation base layer to said anti-diffusion layer; and
- etching said first isolation base layer to form a said at least one first channel extended to said at least one N-type extension electrode portion and a said at least one second channel extended to said anti-diffusion layer, wherein said first isolation base layer is formed as said first isolation portion.

29. The method, as recited in claim 27, wherein said first isolation portion is laminated at said insulating layer.

30. The method, as recited in claim 27, after said first isolation portion is developed on said anti-diffusion layer, further comprising steps of:
- developing an N-type extended electrode portion from said first isolation portion, wherein in said developing process of said at least one N-type extension electrode portion, a N-type extension electrode terminal of said at least one N-type extension electrode portion is formed at said at least one first channel of said first isolation portion and is extended to said N-type gallium nitride layer through said at least one first channel; and
- developing a P-type extended electrode portion from said first isolation portion, wherein in a developing process of said at least one P-type extension electrode portion, a P-type extension electrode terminal of said at least one P-type extension electrode portion is formed at said at least one second channel of said first isolation portion and is extended to said anti-diffusion layer through said at least one second channel.

31. The method as recited in claim 30, after said at least one N-type extension electrode portion and said at least one P-type extension electrode portion are developed to said first isolation portion, further comprising a step of: forming a second isolation portion on said at least one N-type extension electrode portion, said first isolation portion, and said at least one P-type extension electrode portion, wherein said second isolation portion has at least one third channel and at least one fourth channel, wherein said at least one third channel is extended to said at least one N-type extension electrode portion, wherein said N-type electrode is electrically connected to said at least one N-type extension electrode portion through said at least one third channel, wherein said at least one fourth channel is extended to said at least one P-type extension electrode portion, wherein said P-type electrode is electrically connected to said at least one P-type extension electrode portion through said at least one fourth channel.

32. The method as recited in claim 31, in the step of developing said second isolation portion at said at least one N-type extension electrode portion, said first isolation portion, and said at least one P-type extension electrode portion, further comprising the steps of:
- developing a second isolation base layer on said at least one N-type extension electrode portion, said first isolation portion, and said at least one P-type extension electrode portion; and
- etching said second isolation base layer to form said at least one a third channel extended to said at least one N-type extension electrode portion and said at least one fourth channel extended to said at least one P-type extension electrode portion, wherein said second isolation base layer is formed as said second isolation portion.

33. The method as recited in claim 32, wherein the step (e) further comprises steps of:
- (e.1) developing said N-type electrode from said second isolation portion, wherein in a developing process of said N-type electrode, an N-type electrode connection terminal of said N-type electrode is formed at said at least one third channel of said second isolation portion and is electrically connected to said at least one N-type extension electrode portion through said at least one third channel; and
- (e.2) developing said P-type electrode from said first isolation portion, wherein in a developing process of said P-type electrode, a P-type electrode connection terminal of said P-type electrode is formed at said at least one fourth channel of said second isolation portion and is electrically connected to said anti-diffusion layer through said at least one fourth channel.

* * * * *